United States Patent
Okuyama et al.

(10) Patent No.: US 10,366,745 B2
(45) Date of Patent: Jul. 30, 2019

(54) SEMICONDUCTOR DEVICE AND INFORMATION PROCESSING DEVICE

(71) Applicant: HITACHI, LTD., Chiyoda-ku, Tokyo (JP)

(72) Inventors: Takuya Okuyama, Tokyo (JP); Masanao Yamaoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/755,257

(22) PCT Filed: Aug. 27, 2015

(86) PCT No.: PCT/JP2015/074167
§ 371 (c)(1),
(2) Date: Feb. 26, 2018

(87) PCT Pub. No.: WO2017/033326
PCT Pub. Date: Mar. 2, 2017

(65) Prior Publication Data
US 2018/0247691 A1 Aug. 30, 2018

(51) Int. Cl.
| | |
|---|---|
| *G11C 11/34* | (2006.01) |
| *G11C 11/419* | (2006.01) |
| *G06F 7/00* | (2006.01) |
| *G06N 99/00* | (2019.01) |
| *G06F 7/58* | (2006.01) |
| *G06N 7/00* | (2006.01) |
| *G11C 7/10* | (2006.01) |

(Continued)

(52) U.S. Cl.
CPC .............. *G11C 11/419* (2013.01); *G06F 7/00* (2013.01); *G06F 7/588* (2013.01); *G06N 7/005* (2013.01); *G06N 99/00* (2013.01); *G11C 7/1006* (2013.01); *G11C 7/222* (2013.01); *G11C 11/1655* (2013.01); *G11C 11/1657* (2013.01); *G11C 11/1673* (2013.01); *G11C 11/1675* (2013.01)

(58) Field of Classification Search
CPC ..... G11C 11/419; G11C 7/1006; G11C 7/222; G11C 11/1655; G11C 11/1657; G11C 11/1673; G11C 11/1675; G06F 7/588; G06N 7/005
See application file for complete search history.

(56) References Cited

U.S. PATENT DOCUMENTS

2012/0026784 A1* 2/2012 Kanai ...................... G06F 7/588
365/158

FOREIGN PATENT DOCUMENTS

WO    WO 2014/192153 A1    12/2014

OTHER PUBLICATIONS

Takeshi Kawashima et al.; An Architecture of Small-Scaled Neuro-Hardware Using Probabilistically-Calculated Pulse Neurons; 2001; pp. 1520-1525.

(Continued)

*Primary Examiner* — Uyen B Tran
(74) *Attorney, Agent, or Firm* — Miles & Stockbridge PC

(57) ABSTRACT

Provided are a semiconductor device and an information processing device that can be manufactured easily at low cost and can calculate an arbitrary interaction model such as an Ising model. A semiconductor device that performs a non-linear operation includes a memory, a reading unit that reads data from the memory, a majority circuit that inputs a result of a predetermined operation on the data read by the reading unit, and a write circuit that receives an output of the majority circuit, a value of a predetermined signal is stochastically inverted at a preceding stage of the majority circuit.

4 Claims, 19 Drawing Sheets

(51) Int. Cl.
    *G11C 7/22*       (2006.01)
    *G11C 11/16*      (2006.01)

(56) References Cited

OTHER PUBLICATIONS

Office Action dated Mar. 5, 2019 for Japanese patent application No. 2017-536145.
Masanao Yamaoka, et al. "20k-spin Ising Chip for Combinational Optimization Problem with CMOS Annealing", Mar. 19, 2015, IEEE, 5 pages.
Yuta Saho et al., "Associative memory model storing memory pattern with correlation structure", Institute of Electronics, Information and Communication Engineers Techical Report, Neurocomputing, Sep. 27, 2012, vol. 112, No. 227, pp. 43-48 with English translation.
Extended European Search Report dated Mar. 21, 2019 for European paten application No. 15902295.3.
Peter D. Hortensius et al., "VLSI computing architectures for Ising model simulation", Intergation, The VLSI Journal., vol. 8, No. 2, Nov. 1, 1989, pp. 155-172.
Y. Lin et al., "Monte Carlo simulation of the Ising model on FPGA", Journal of Computation Physics, London, GB, vol. 237, Dec. 17, 2012, pp. 224-234.
Nobuyasu Ito et al., "Monte Carlo Simulation of the Ising Model and Random Number Generation on the Vector Processor", Proceedings of the Supercomputing Conference, New York, Nov. 12-16, 1990, Washington, IEEE Comp. Soc. Press, US, vol. Conf. 3, Nov. 12, 1990, pp. 753-763.

\* cited by examiner

[Fig. 1]
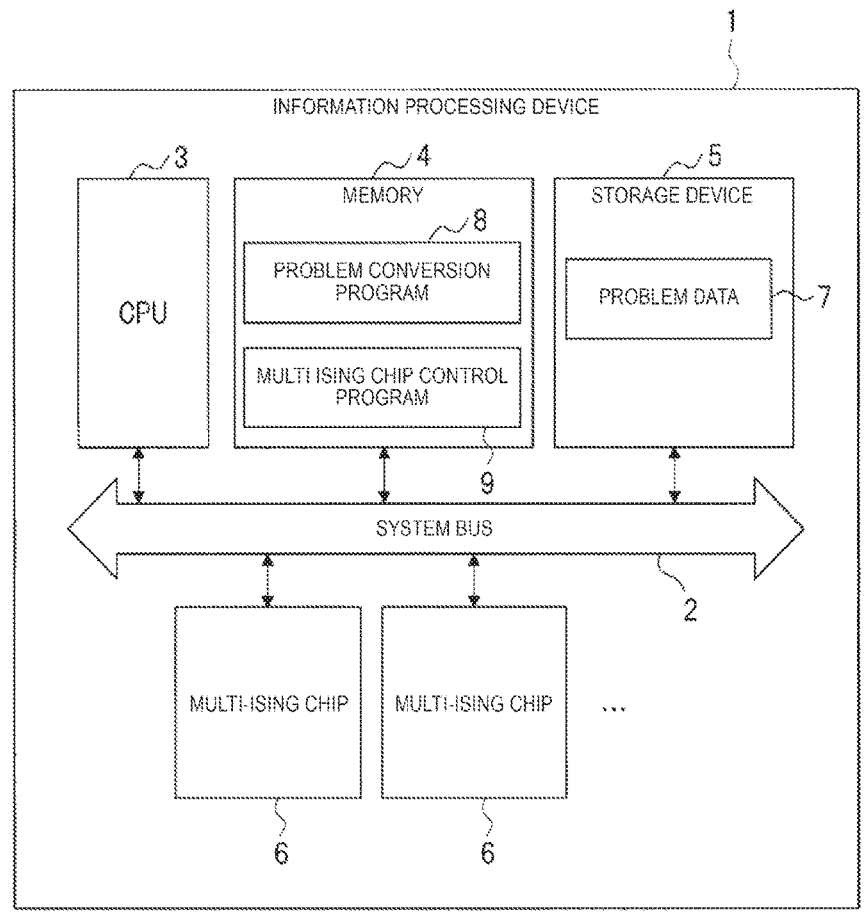

[Fig. 2]
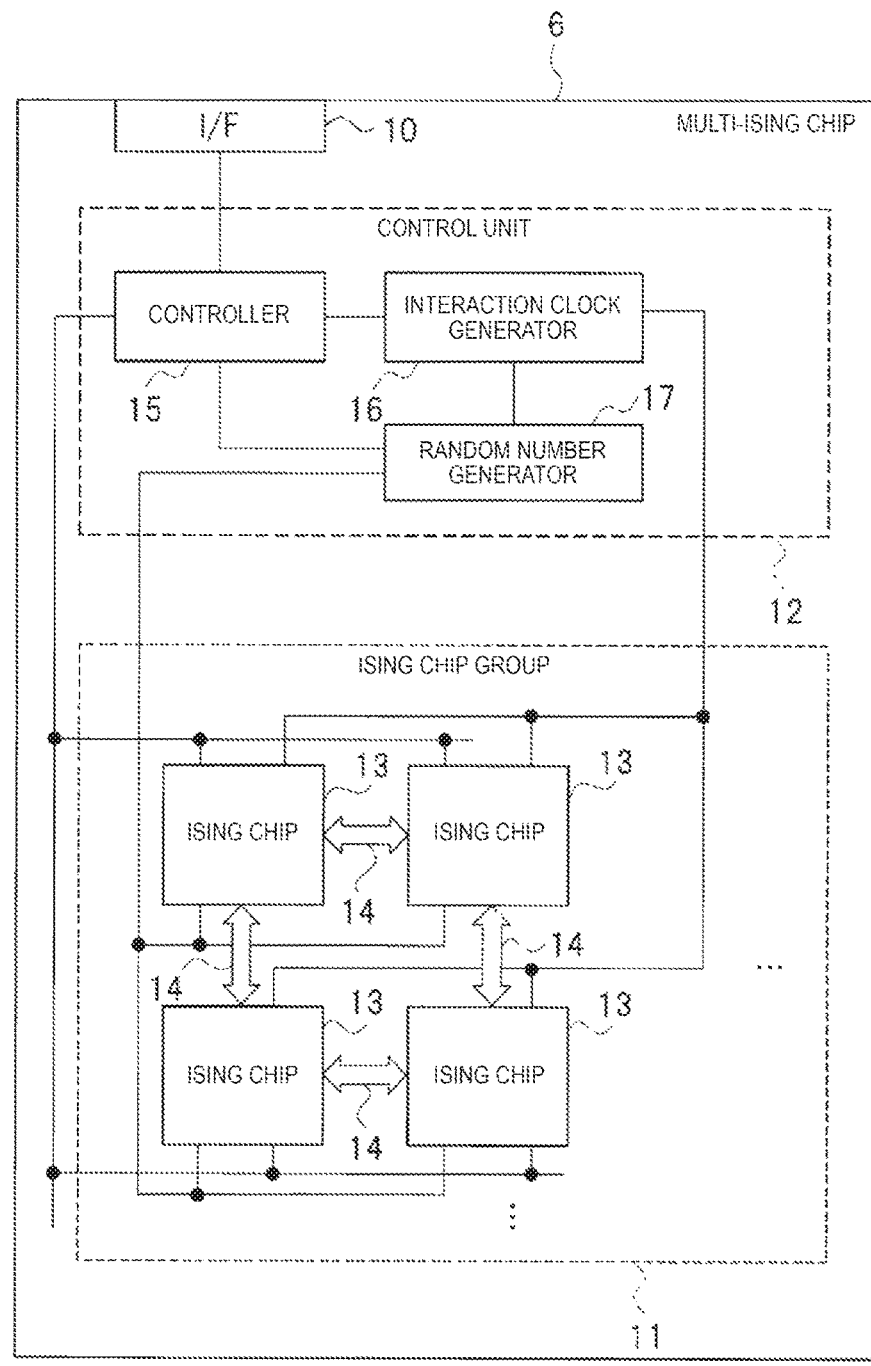

[Fig. 3]
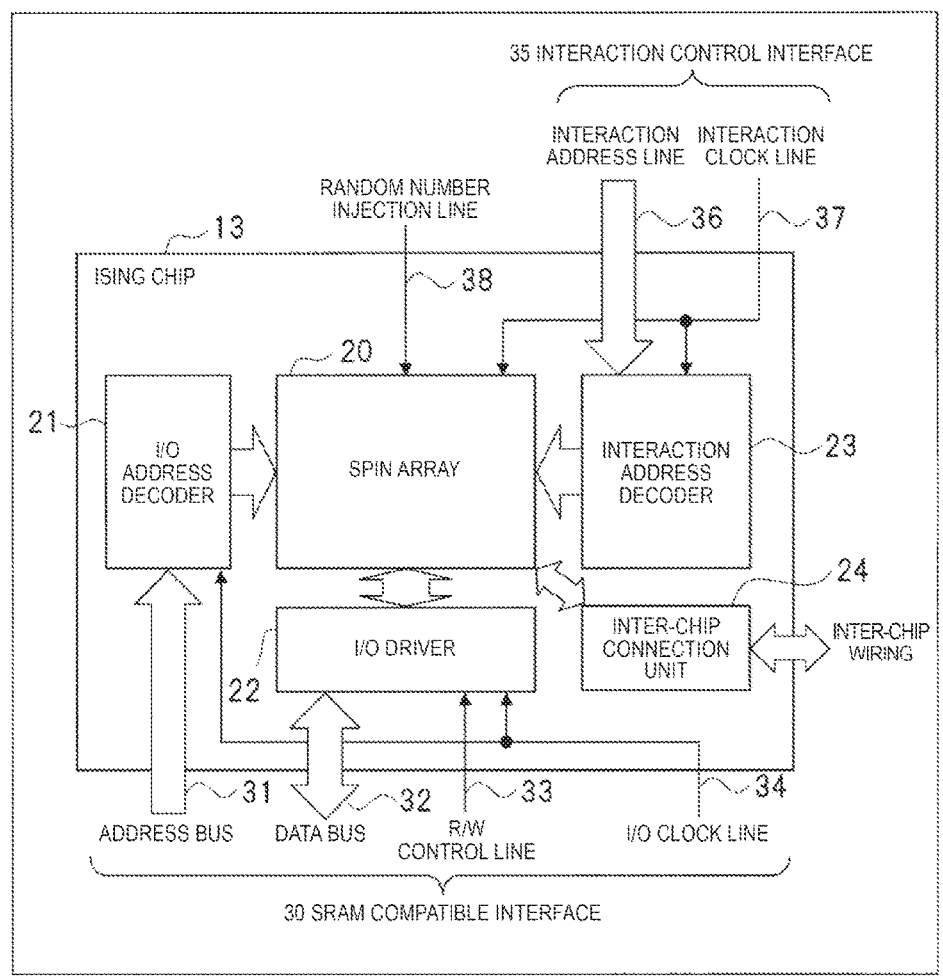

[Fig. 4]
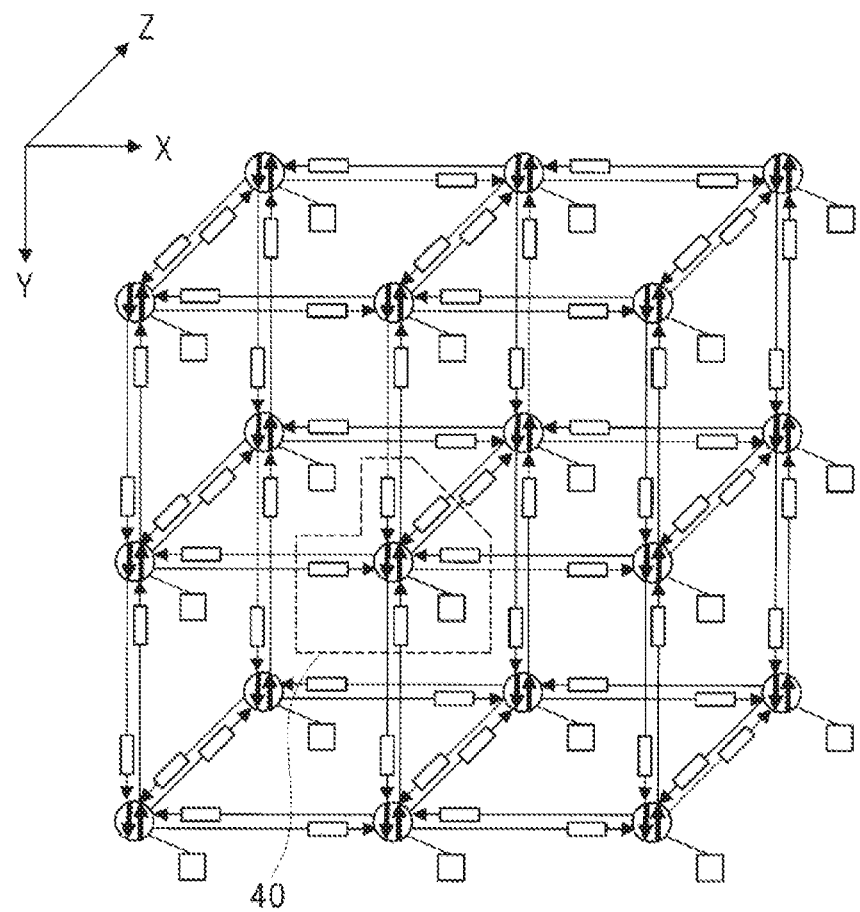

[Fig. 5]
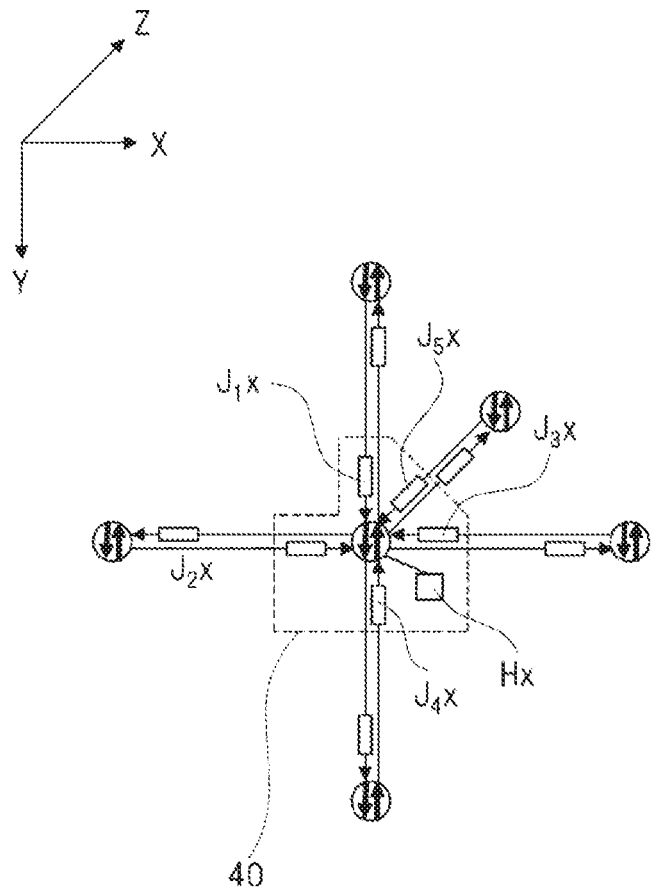

[Fig. 6]
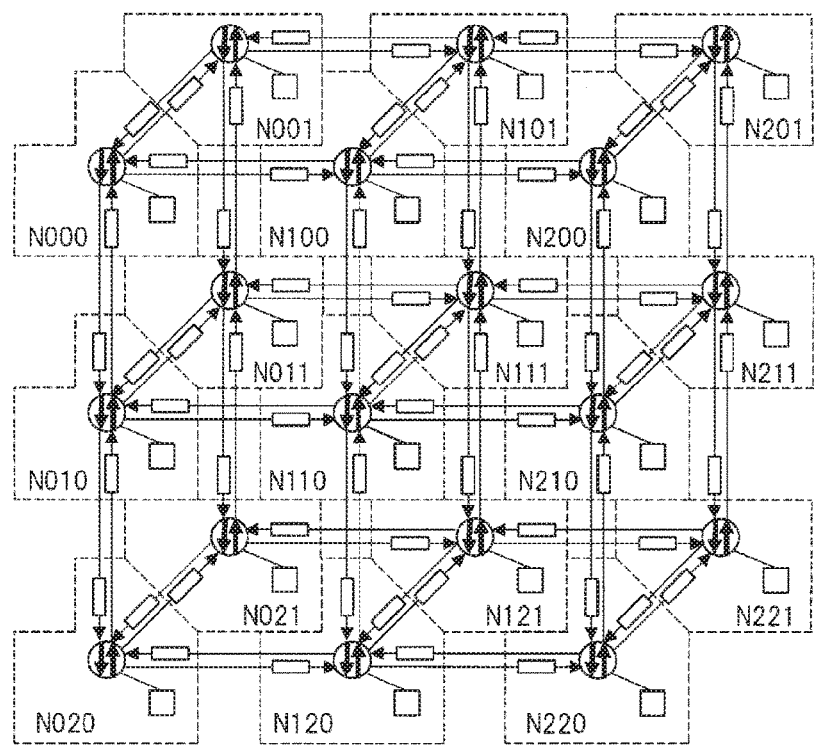

[Fig. 7]
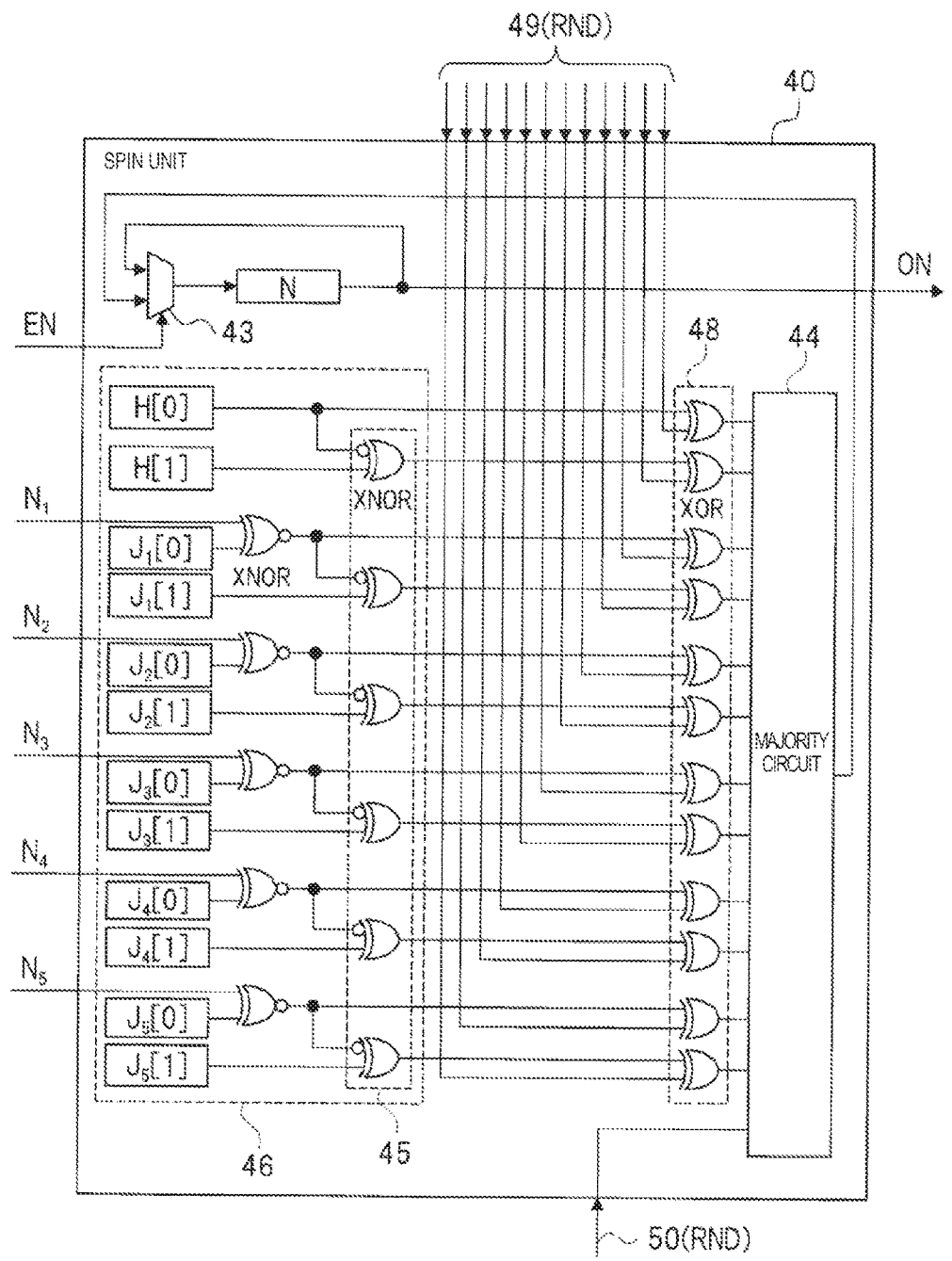

[Fig. 8]
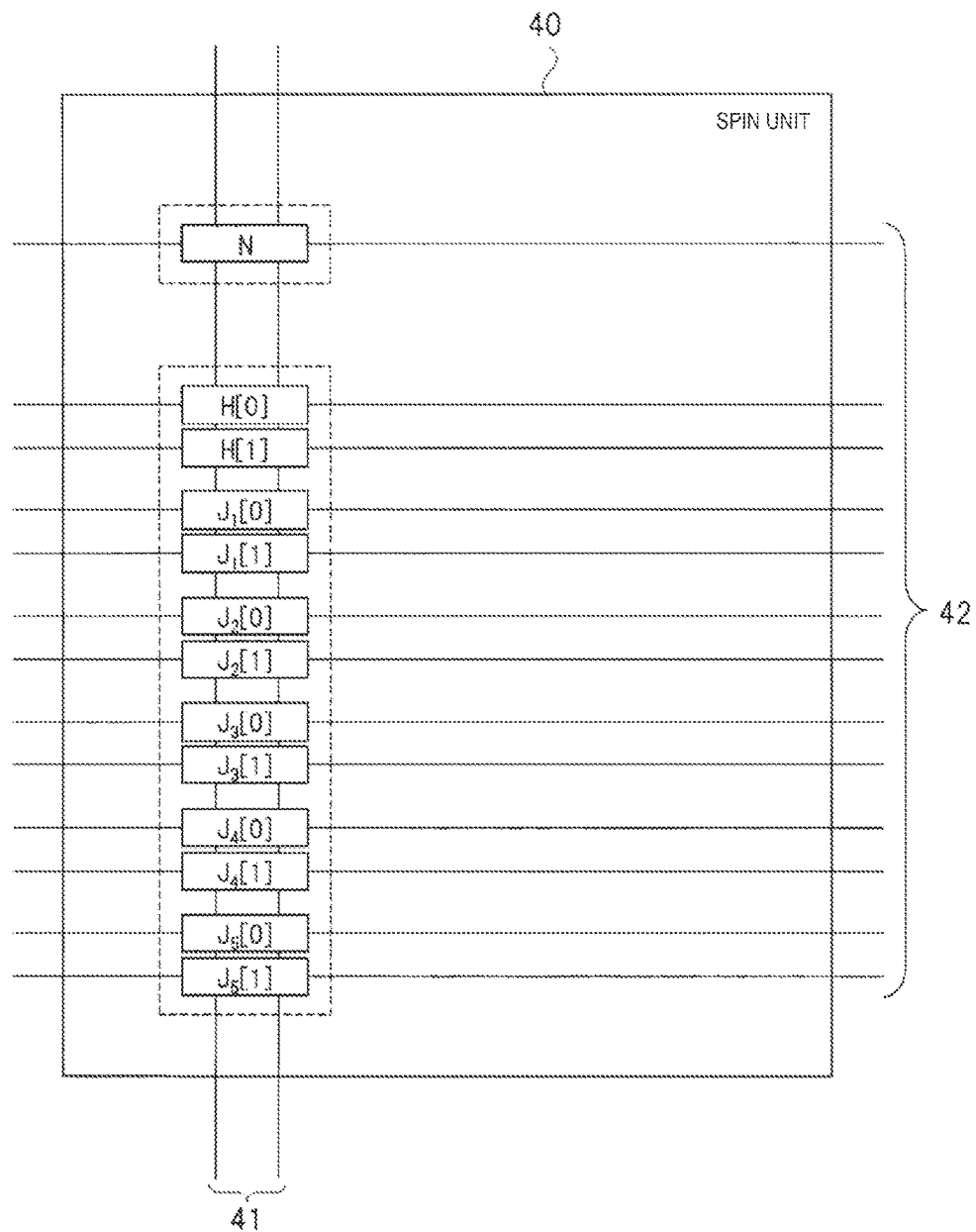

[Fig. 9]
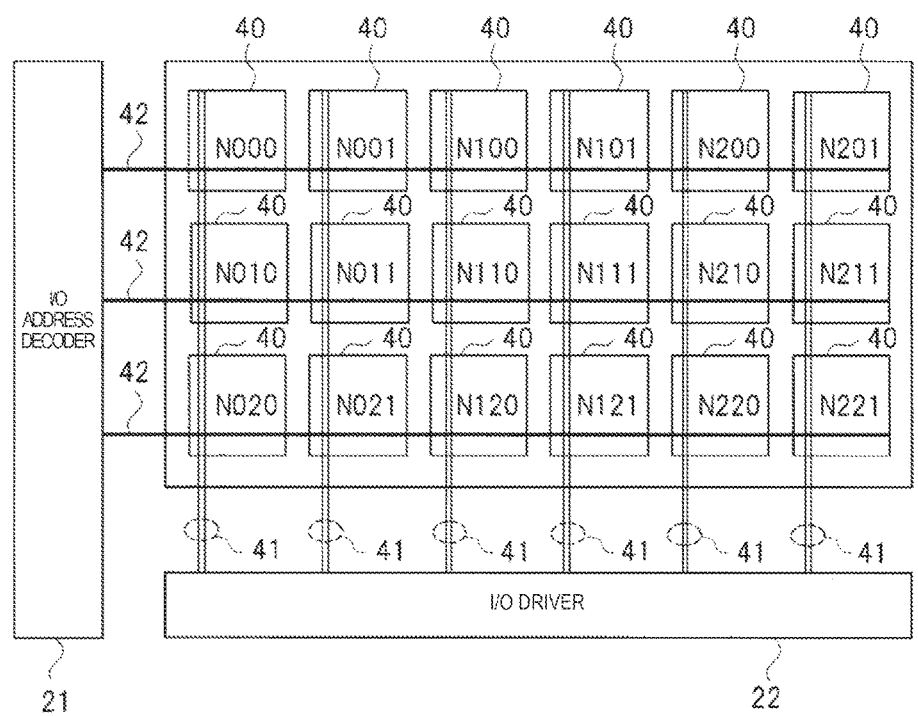

[Fig. 10]
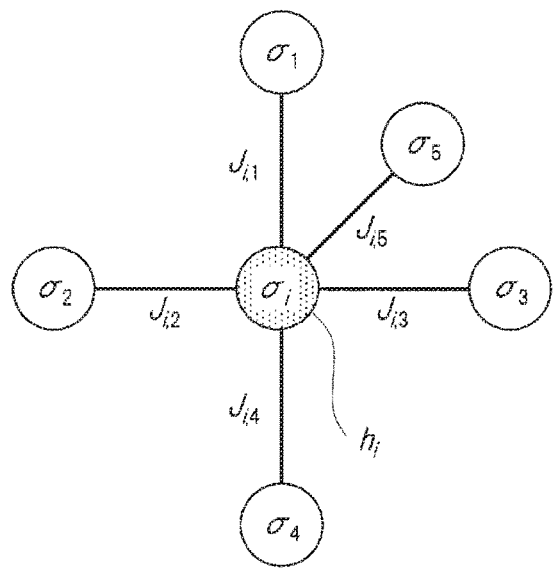

[Fig. 11]
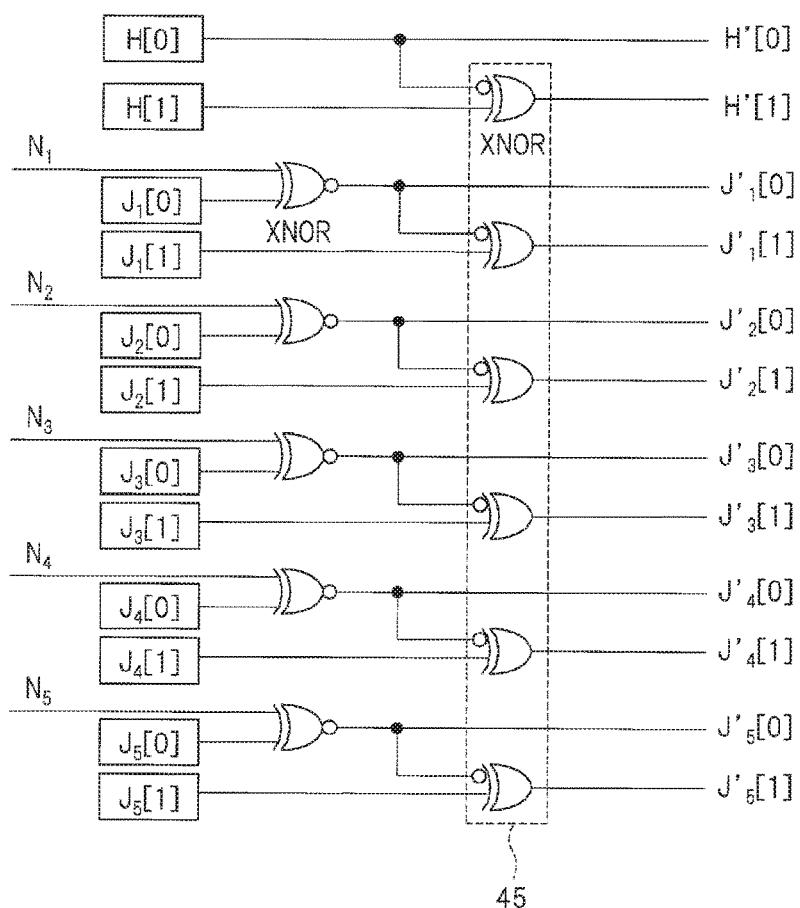

[Fig. 12A]

| $h_i$ | H[0] | H[1] | H'[0] | H'[1] |
|---|---|---|---|---|
| 1 | 1 | 1 | 1 | 1 |
| 0 | 1 | 0 | 1 | 0 |
| -1 | 0 | 1 | 0 | 0 |

[Fig. 12B]

| $\sigma_k$ | $N_k$ | $J_{i,k}$ | $J_k[0]$ | $J_k[1]$ | $J'_k[0]$ | $J'_k[1]$ |
|---|---|---|---|---|---|---|
| 1 | 1 | 1 | 1 | 1 | 1 | 1 |
| 1 | 1 | 0 | 1 | 0 | 1 | 0 |
| 1 | 1 | -1 | 0 | 1 | 0 | 0 |
| -1 | 0 | 1 | 1 | 1 | 0 | 0 |
| -1 | 0 | 0 | 1 | 0 | 0 | 1 |
| -1 | 0 | -1 | 0 | 1 | 1 | 1 |

[Fig. 13A]
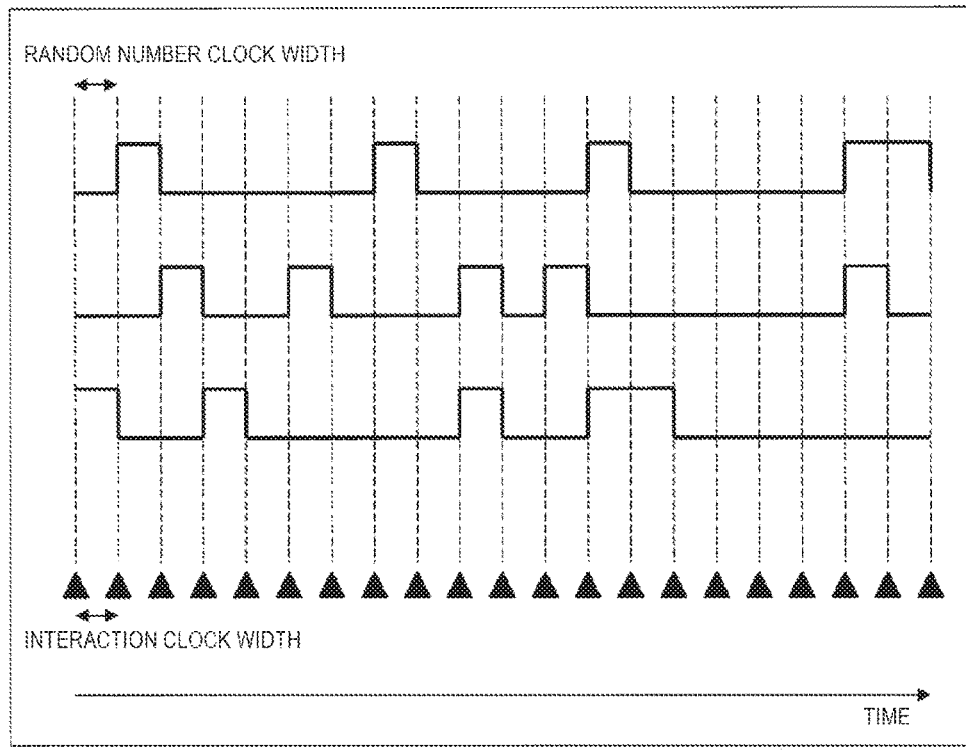
[Fig. 13B]
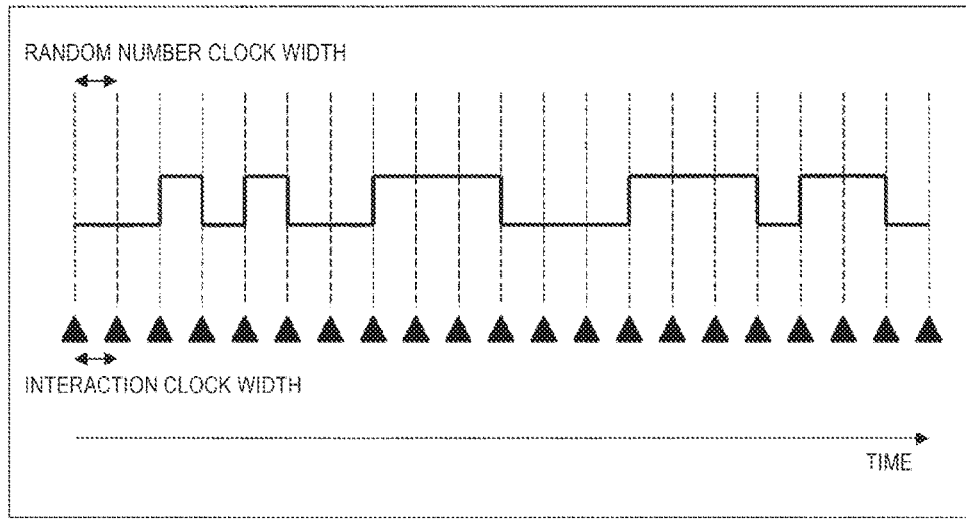

[Fig. 14]
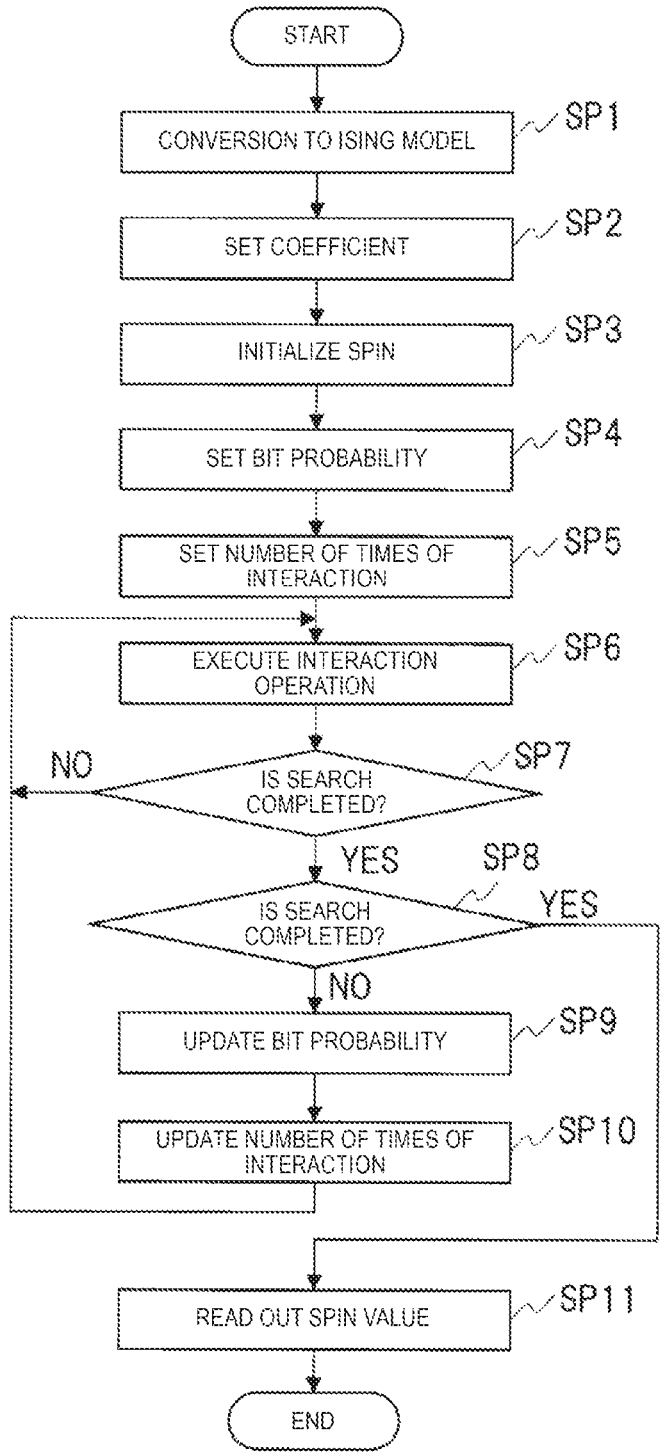

[Fig. 15A]
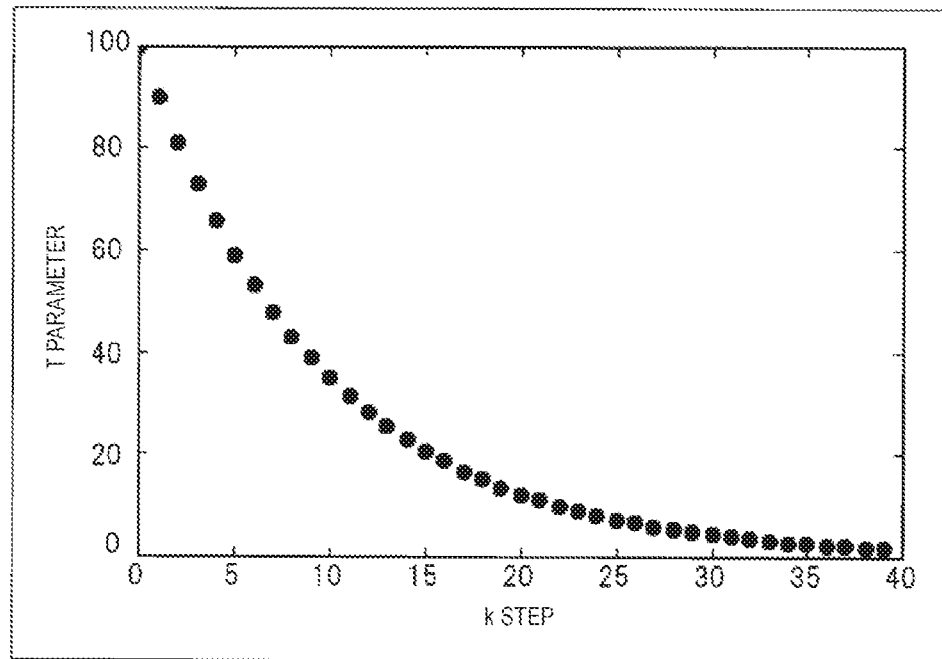
[Fig. 15B]
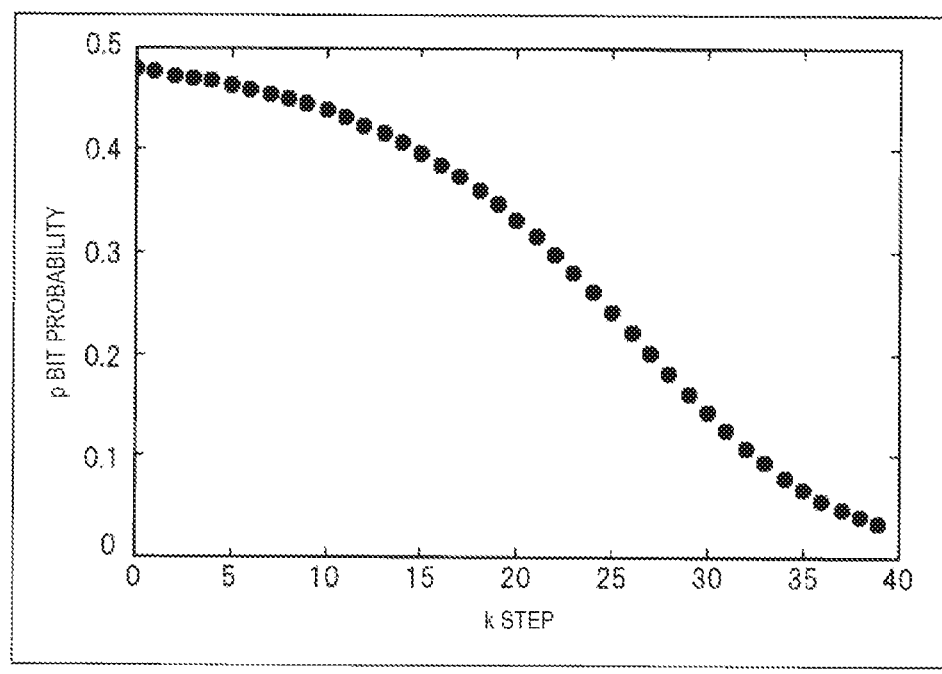

[Fig. 16]
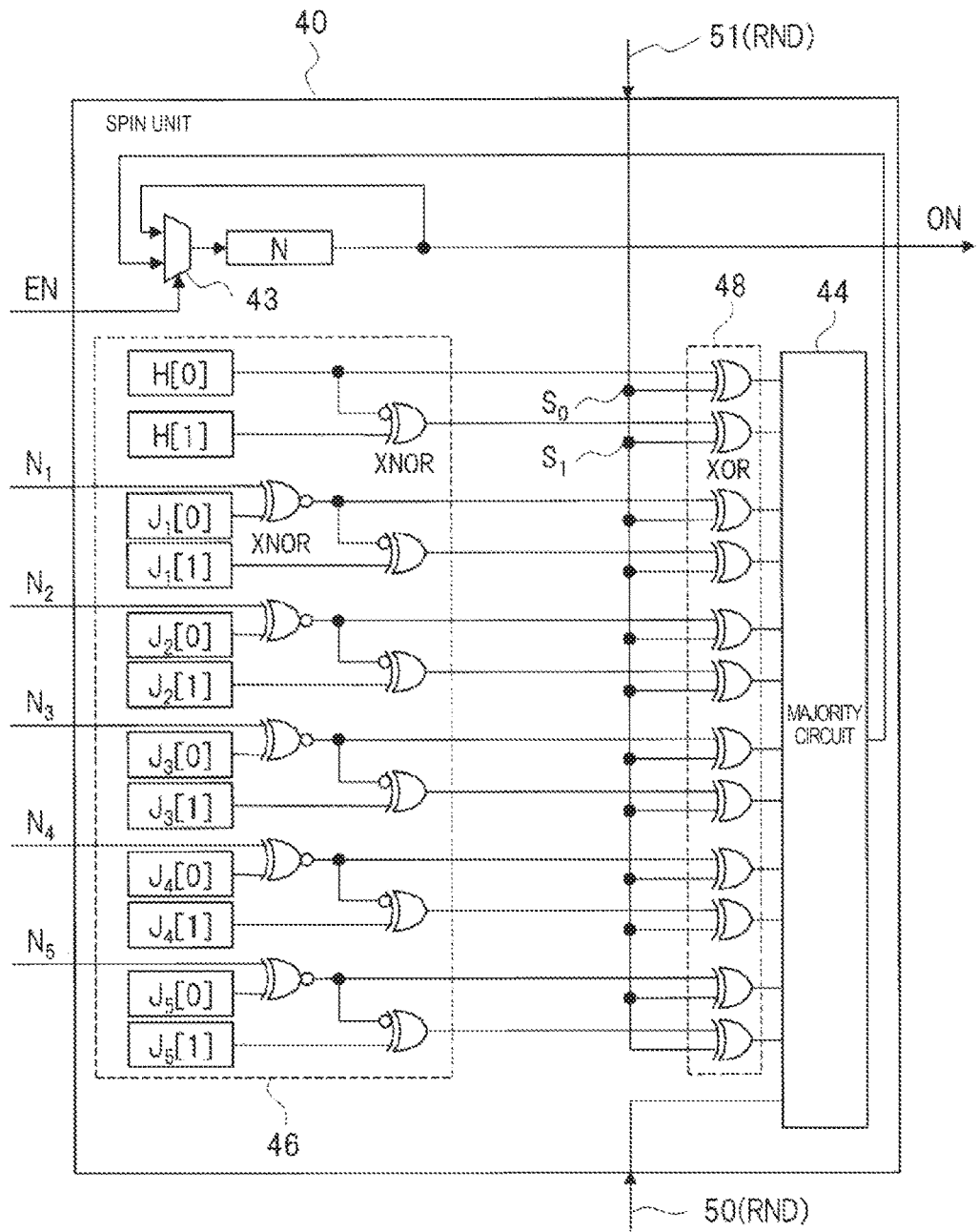

[Fig. 17]
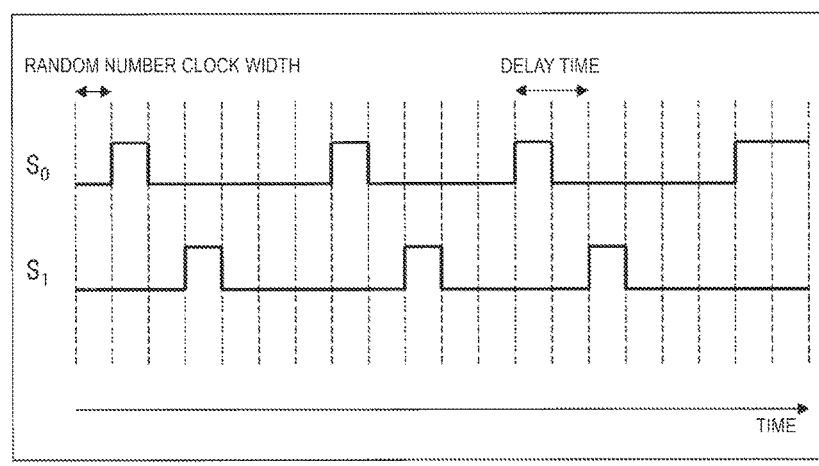

[Fig. 18]
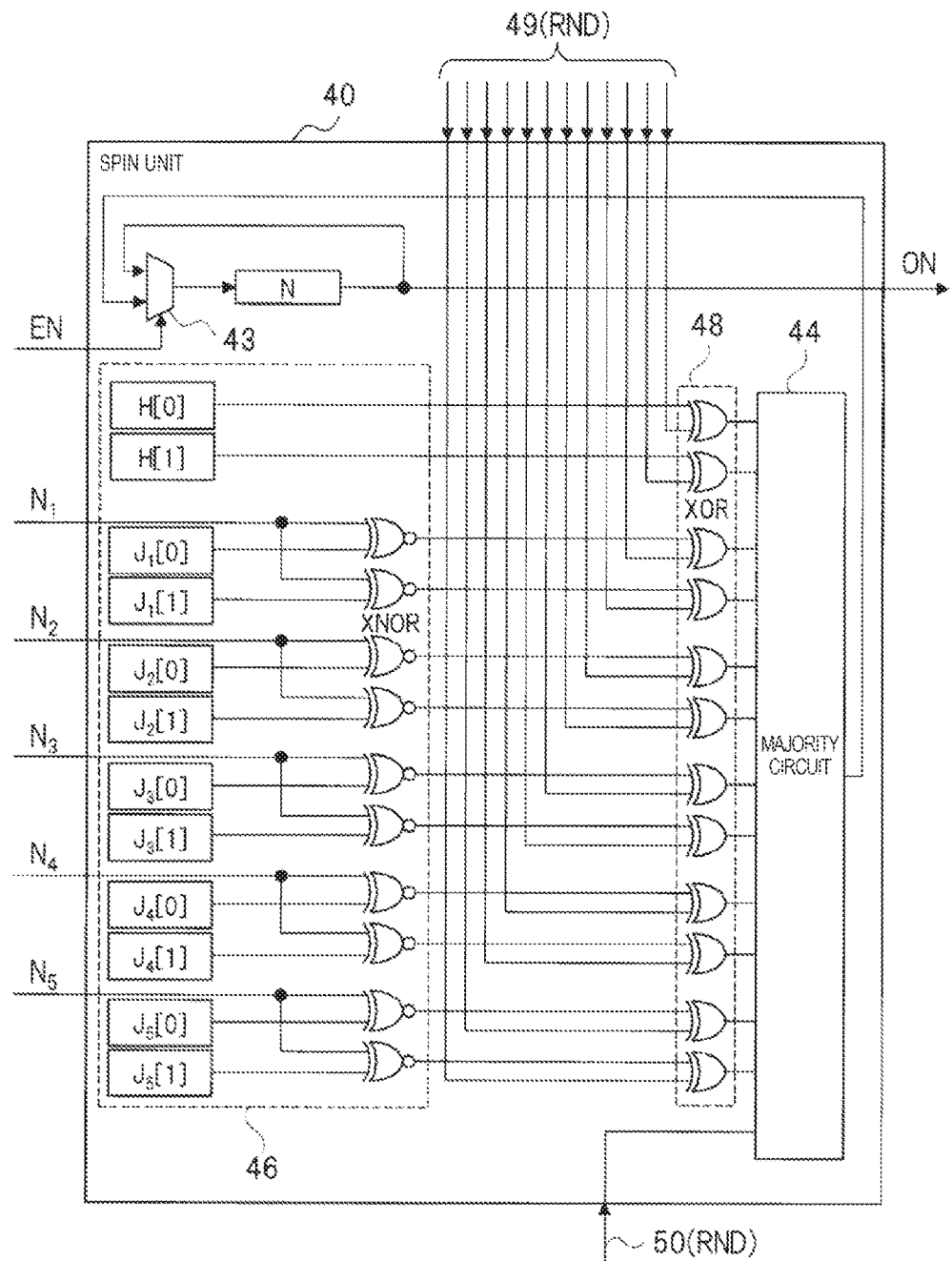

[Fig. 19]
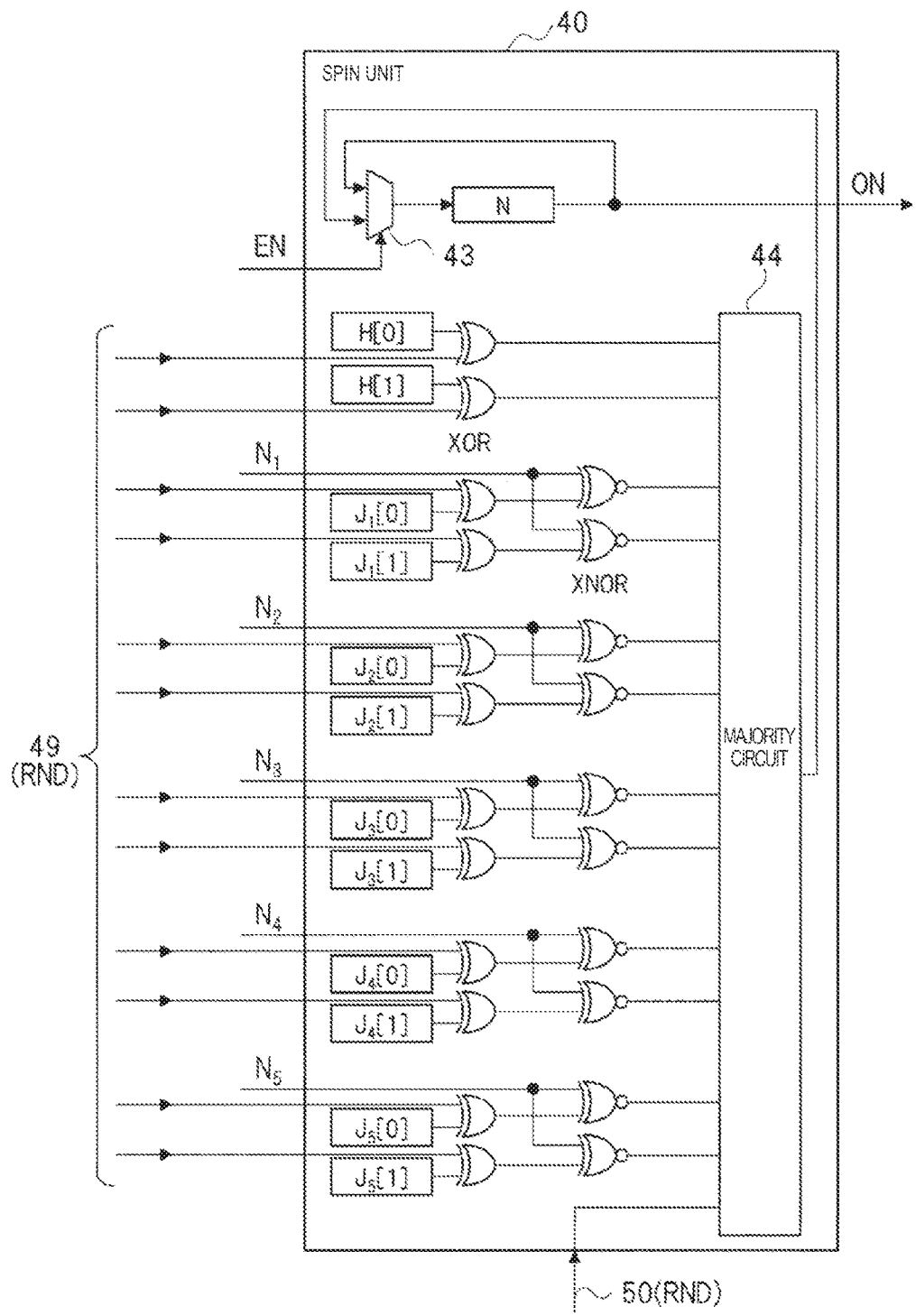

SEMICONDUCTOR DEVICE AND INFORMATION PROCESSING DEVICE

TECHNICAL FIELD

The present invention relates to a semiconductor device and an information processing device, and is particularly suitable for application to a semiconductor device that calculates an interaction model and an information processing device that controls the semiconductor device as an accelerator.

BACKGROUND ART

Various physical phenomena and social phenomena can be represented by interaction models. The interaction model is a model which is defined by a plurality of nodes constituting the model and an interaction between the nodes and, if necessary, a bias for each node. Various models have been proposed in physics and social science, which can all be interpreted as a form of the interaction model.

As an example of a typical interaction model in the field of physics, an Ising model can be mentioned. The Ising model is a model of statistical mechanics to explain the behavior of a magnetic material. The Ising model is defined by spins having binary values of +1 and −1 (or 0 and 1, up and down), an interaction coefficient indicating an interaction between spins, and an external magnetic field coefficient for each spin.

The Ising model can calculate an energy at that time, from the spin arrangement, the interaction coefficient, and the external magnetic field coefficient, which are given. The energy function of the Ising model is generally expressed by the following expression.

[Expression 1]

$$H(\sigma) = -\sum_{i<j} J_{i,j} \sigma_i \sigma_j - \sum_i h_i \sigma_i \quad (1)$$

In addition, $\sigma_i$ and $\sigma_j$ represent the values of i-th and j-th spins, respectively, $J_{i,j}$ represents an interaction coefficient between the i-th and j-th spins, $h_i$ represents the external magnetic field coefficient for the i-th spin, $\sigma$ represents the spin arrangement.

In Expression (1), the first term is to calculate the energy resulting from the interaction between spins. In general, the Ising model is expressed as an undirected graph, and it does not distinguish between the interaction from the i-th spin to the j-th spin and the interaction from the j-th spin to the i-th spin. Therefore, in the first term, the influence of the interaction coefficient is calculated for combinations of $\sigma_i$ and $\sigma_j$ satisfying i<j. The second term is to calculate the energy resulting from the external magnetic field for each spin.

The ground-state search of Ising model is an optimization problem to find a spin arrangement that minimizes the energy function (also referred to as Hamiltonian in general) of the Ising model. It is known that the ground-state search of Ising model represented by a nonplanar graph is NP hard. In recent years, a device that searches for a ground state in order to solve this problem efficiently has been proposed (PTL 1).

CITATION LIST

Patent Literature

PTL 1: Pamphlet of International Publication No. 2014/192153

SUMMARY OF INVENTION

Technical Problem

In general, a simulated annealing method (hereinafter, referred to as an SA method) is known as an algorithm for solving an optimization problem. The SA method includes neighborhood search based on transition probability and temperature scheduling.

In the neighborhood search, transition is repeated stochastically to a certain state $\sigma'$ in the vicinity of the current state $\sigma$. Since there is a possibility of falling into a local solution if transition is always made to a low energy state, state transition is made stochastically. The same applies to a state with high energy. The probability of transition from a state $\sigma$ to a state $\sigma'$ is referred to as a transition probability $P(\sigma, \sigma')$. As a calculation method thereof, a thermal bath method or a metropolis method is known. For example, the transition probability by the thermal bath method is as Expression (2).

[Expression 2]

$$P(\sigma, \sigma') = \frac{1}{2}\left\{1 + \tanh\left(-\frac{H(\sigma') - H(\sigma)}{T}\right)\right\} \quad (2)$$

T is a parameter commonly referred to as temperature, which represents ease of transition between states. T is set to a large value in an initial state of the SA method, and stochastic state transition is repeated while gradually decreasing T. Thus, a solution converges asymptotically to an optimal solution or an approximate solution sufficiently close to the optimal solution.

However, in the device disclosed in the above-mentioned PTL 1, a stochastic algorithm contrary to a balancing condition to be satisfied by the SA method is adopted. This is an algorithm omitting calculation of the transition probability of the SA method, and as a result, there arises a problem that the accuracy of the solution obtained by the device is lowered. In addition, it is necessary to increase the number of transitions in order to obtain a highly accurate solution, and thus it is difficult to shorten the calculation time.

This problem can be solved by obtaining the transition probability required by the thermal bath method by using an adder and a multiplier and comparing it with a uniform random number. However, there is a problem that not only the circuit area increases and scalability and energy efficiency decrease, but also it cannot be manufactured at low cost.

Therefore, it is required not to excessively simplify the stochastic process based on the non-linear operation required by the thermal bath method, but to realize it with high accuracy with hardware of a small circuit area.

An object of the present invention is to provide a semiconductor device and an information processing device that can be manufactured at low cost and easily, and can calculate an arbitrary interaction model such as an Ising model.

The above and other objects and novel features of the present invention will become apparent from the description of this specification and the accompanying drawings.

Solution to Problem

A brief description about the overview of representative of the invention disclosed in the present application is as follows.

A semiconductor device according to an embodiment is a semiconductor device that performs a non-linear operation. The semiconductor device includes a memory, a reading unit that reads data from the memory, a majority circuit that inputs a result of a predetermined operation on the data read by the reading unit, and a write circuit that receives an output of the majority circuit, and a value of a predetermined signal is stochastically inverted at a preceding stage of the majority circuit.

Another semiconductor device according to an embodiment is a semiconductor device that performs calculation of an interaction model. The semiconductor device includes a plurality of memories that retain one or a plurality of values, respectively, a reading unit that reads data from the plurality of memories, a majority circuit that inputs a result of a predetermined operation on the data read by the reading unit, and a write circuit that receives an output of the majority circuit, and a value of a predetermined signal is stochastically inverted at a preceding stage of the majority circuit.

An information processing device according to one embodiment is an information processing device in which a semiconductor device which is operable as a CPU, a main memory, a storage device, and an accelerator is connected through a system bus. The semiconductor device is a semiconductor device that performs a non-linear operation, and has the same configuration as the semiconductor device of the above one embodiment.

Advantageous Effects of Invention

The following is a brief description of effects obtained from the representative of the invention disclosed in the present application.

According to an embodiment, it is possible to provide a semiconductor device and an information processing device that can be manufactured easily at low cost and can calculate an arbitrary interaction model such as an Ising model.

BRIEF DESCRIPTION OF DRAWINGS

FIG. 1 is a block diagram showing an example of the overall configuration of an information processing device including a semiconductor device of Embodiment 1.

FIG. 2 is a block diagram showing an example of a configuration of a multi-Ising chip, in Embodiment 1.

FIG. 3 is a block diagram showing an example of a configuration of the Ising chip, in Embodiment 1.

FIG. 4 is a conceptual diagram illustrating an example of a configuration of a spin array of a three-dimensional lattice, in Embodiment 1.

FIG. 5 is a conceptual diagram for explaining the configuration of the spin array, in Embodiment 1.

FIG. 6 is a conceptual diagram for explaining the configuration of the spin array, in Embodiment 1.

FIG. 7 is a block diagram showing an example of a configuration of a spin unit, in Embodiment 1.

FIG. 8 is a block diagram showing an example of a configuration of the spin unit, in Embodiment 1.

FIG. 9 is a block diagram showing an example of an arrangement of the spin unit on the Ising chip, in Embodiment 1.

FIG. 10 is a diagram of the Ising model for explaining the spin unit shown in FIG. 7, in Embodiment 1.

FIG. 11 is a block diagram in which one place of the spin unit shown in FIG. 7 is extracted, in Embodiment 1.

FIG. 12A is a conceptual diagram for explaining a calculation result by coefficients and spin values, in Embodiment 1.

FIG. 12B is a conceptual diagram for explaining a calculation result by coefficients and spin values, in Embodiment 1.

FIG. 13A is a diagram for explaining a random number to be injected into the spin unit, in Embodiment 1.

FIG. 13B is a diagram for explaining a random number to be injected into the spin unit, in Embodiment 1.

FIG. 14 is a flowchart showing a processing procedure of a ground-state search process, in Embodiment 1.

FIG. 15A is a diagram for explaining a control method for the random number to be injected into the spin unit, in Embodiment 1.

FIG. 15B is a diagram for explaining the control method for the random number to be injected into the spin unit, in Embodiment 1.

FIG. 16 is a block diagram showing an example of a configuration of a spin unit of Embodiment 2.

FIG. 17 is a diagram for explaining a random number to be injected into the spin unit, in Embodiment 2.

FIG. 18 is a block diagram showing an example of a configuration of a spin unit of Embodiment 3.

FIG. 19 is a block diagram showing an example of a configuration of a spin unit of Embodiment 4.

DESCRIPTION OF EMBODIMENTS

In the following embodiments, when necessary for convenience, a description will be made by separating the invention into a plurality of sections or embodiments, but unless otherwise specified, they are not unrelated to each other, one is in a relationship such as a modification, details, supplementary explanation, or the like of a part or the whole of the other. Further, in the following embodiments, in a case of referring to the number of elements (including number, numerical value, quantity, range, or the like), except for a case where it is expressly specified, and a case where it is obviously limited to a specific number in principle, or the like, it is not limited to the specific number, and it may be the specific number or more or or less.

Furthermore, in the following embodiments, it goes without saying that the constituent elements (including element steps or the like) are not essential, except for the case where they are explicitly stated or the case where it is considered to be essential obviously in principle. Similarly, in the following embodiments, when referring to shapes, positional relationships, or the like, except for the case where they are explicitly stated and the case where it is considered not to be essential obviously in principle, it is assumed that shapes substantially approximate or similar to its shape and the like are included. This also applies to the above numerical value and range.

Hereinafter, embodiments will be described in detail with reference to the drawings. In addition, in all of the drawings for describing the embodiments, the same or related reference numerals will be given to the same members in principle, and the repetitive description thereof will be omitted. In the following embodiments, the description of the same or similar parts will not be repeated in principle unless it is particularly necessary.

Embodiment 1

Embodiment 1 relates to a semiconductor device and an information processing device that can be manufactured easily at low cost and can calculate an arbitrary interaction model such as an Ising model.

(1) Interaction Model

Various physical phenomena and social phenomena can be represented by interaction models. The interaction model is a model which is defined by a plurality of nodes constituting the model and an interaction between the nodes and, if necessary, a bias for each node. Various models have been proposed in physics and social science, which can all be interpreted as a form of the interaction model.

In addition, the interaction model is characterized in that the influence between nodes is limited to the interaction between two nodes (interaction between two bodies). For example, considering the dynamics of the planet in outer space, it can be interpreted as a type of an interaction model in terms of an interaction by universal gravitation between nodes which are planets, but the interplanetary influence is not limited to between two planets, and it shows complicated behavior in which three or more planets influence each other (it is a so-called three body problem or multiple body problem).

As an example of a typical interaction model in the field of physics, an Ising model can be mentioned. The Ising model is defined by an interaction coefficient that determines the interaction between two spins and the external magnetic field coefficient that is the bias for each spin, with a spin that has two states of +1 and −1 (or up, down, or the like) as a node.

Further, in the biology world, a neural network modeling the brain is an example of an interaction model. In the neural network, artificial neurons have interaction referred to as synaptic connections, using artificial neurons modeling neurons of nerve cells as nodes. There is also a case where bias is given to each neuron.

In the world of social science, for example, considering human communication, it can be easily understood that nodes which are humans have interaction formed by language and communication. It can be expected that each human has an individual bias. Therefore, researches have been made to clarify its characteristics by simulating human communication as an Ising model or the like common in terms of the interaction model.

In the following, examples of a semiconductor device that performs ground-state search of Ising model and an information processing device that controls the semiconductor device as an accelerator will be described.

(2) Ising Model Extended to Directed Graph

In the present embodiment, a model represented by the following Expression (3), which is an extension of the Ising model, is hereinafter referred to as the Ising model.

[Expression 3]

$$H(\sigma) = -\frac{1}{2}\sum_{i \neq j} J_{i,j}\sigma_i\sigma_j - \sum_i h_i\sigma_i \quad (3)$$

Differently from the Ising model expressed by Expression (1), the interaction as represented by a directed graph is permitted in Expression (3). In general, the Ising model can be drawn as an undirected graph in graph theory. This is because the interaction of an Ising model does not distinguish between the interaction coefficient $J_{i,j}$ from the i-th spin to the j-th spin and the interaction coefficient $J_{j,i}$ from the j-th spin to the i-th spin.

Since the present invention is an extension of the Ising model and can be applied even if $J_{i,j}$ and $J_{j,i}$ are distinguished, an Ising model of a directed graph is handled in the present embodiment. In addition, in a case of handling the Ising model of the undirected graph with the Ising model of the directed graph, it is possible to simply define the same interaction coefficient for both directions of $J_{i,j}$ and $J_{j,i}$. In this case, even for the same model, the energy value in the energy function of Expression (3) is doubled with respect to the energy function of Expression (1).

(3) Configuration of Information Processing Device in the Present Embodiment <<(3-1) Overall Configuration of Information Processing Device Including Semiconductor Device>>

The overall configuration of an information processing device including a semiconductor device will be described with reference to FIGS. 1 and 2. FIG. 1 is a block diagram showing an example of the overall configuration of an information processing device including a semiconductor device of Embodiment 1. FIG. 2 is a block diagram showing an example of a configuration of a multi-Ising chip, in Embodiment 1.

In FIG. 1, 1 indicates the information processing device according to the present embodiment as a whole. This information processing device 1 is composed of a personal computer, a workstation, or a server, and includes a central processing unit (CPU) 3, a memory 4, a storage device 5, and a plurality of multi-Ising chips 6, which are connected through a system bus 2.

The CPU 3 is a processor that controls the operation of the entire information processing device 1. The memory 4 is composed of, for example, a volatile semiconductor memory, and is used for storing various programs. The storage device 5 is composed of, for example, a hard disk drive, a solid state drive (SSD) or the like, and is used to retain programs and data for a long period.

In the case of the present embodiment, the problem data 7 of a single and Ising model format problem which is to be solved by the information processing device 1 is stored in the storage device 5, and the problem conversion program 8 and the multi-Ising chip control program 9 are stored in the memory 4. The problem conversion program is a program that divides the Ising model of such a problem into multiple partial problems as necessary and distributes these partial problems to individual multi-Ising chips 6, respectively. The multi-Ising chip control program. 9 is a program for performing control for solving corresponding partial problems in individual multi-Ising chips 6. The partial problem is a single Ising model format problem independent of other partial problems.

In addition, a program for converting problem data that is not the Ising model format into problem data 7 of the Ising model format may be stored in the memory 4. By doing this, it is possible to handle problems that are not the Ising model format, and the usefulness of the information processing device 1 can be improved.

The multi-Ising chip 6 is dedicated hardware performing the ground-state search of Ising model, and has a form of an expansion card to be attached to the information processing device 1, for example, like a graphics processing unit (GPU) which is dedicated hardware for screen rendering processing.

In the present embodiment, the multi-Ising chip 6 corresponds to a semiconductor device which performs the non-linear operation of the present invention. The multi-Ising chip 6 is a semiconductor device operable as an accelerator in the information processing device 1.

As shown in FIG. 2, the multi-Ising chip 6 includes an interface (I/F) 10, an Ising chip group 11, and a control unit 12, and transmits and receives commands and information to and from the CPU 3 (FIG. 1) through the interface 10 and the system bus 2 (FIG. 1).

The Ising chip group 11 is composed of a plurality of Ising chips 13 each of which is dedicated hardware performing a ground-state search of Ising model. Ising chips 13 are connected by an inter-chip connector 14, and Ising chips 13 transmit and receive necessary information through the inter-chip wiring 14.

The control unit 12 has a function of controlling each Ising chip 13 constituting the Ising chip group 11, and is configured to include a controller 15, an interaction clock generator 16 and a random number generator 17.

The controller 15 is a processor that controls the operation of the entire multi-Ising chip 6, and controls the operation of each Ising chip 13 constituting the Ising chip group 11, and the interaction clock generator 16 and the random number generator 17, according to the command given from the CPU 3 (FIG. 1) of the information processing device 1 through the system bus 2 (FIG. 1) and the interface 10.

The interaction clock generator 16 is a clock generator generating an interaction clock to be described later. The interaction clock generated by the interaction clock generator 16 is given to each Ising chip 13 constituting the Ising chip group 11. The random number generator 17 generates a random number which is a random bit string used in the ground-state search executed in each Ising chip 13 as described later. The random number generated by the random number generator 17 is given to each Ising chip 13.

<<(3-2) Configuration of Ising Chip>>

The configuration of the Ising chip will be described with reference to FIG. 3. FIG. 3 is a block diagram showing an example of a configuration of an Ising chip, in Embodiment 1.

As shown in FIG. 3, the Ising chip 13 includes a spin array 20, an input/output (I/O) address decoder 21, an I/O driver 22, an interaction address decoder 23 and an inter-chip connection unit 24. In the present embodiment, the Ising chip 13 is described assuming that it is mounted as a complementary metal-oxide semiconductor (CMOS) integrated circuit which is now widely used, but other solid elements can also be realized.

The Ising chip 13 includes an address bus 31, a data bus 32, an R/W control line 33, and an I/O clock line 34 as an SRAM compatible interface 30 for performing reading from and writing from the spin array 20. The Ising chip 13 also includes an interaction address line 36 and an interaction clock line 37 as an interaction control interface 35 for controlling the ground-state search of an Ising model.

In the Ising chip 13, the spin $\sigma_i$, the interaction coefficient $J_{i,j}$, and the external magnetic field coefficient $h_i$ of the Ising model are all represented by information stored in the memory cells in the spin array 20. The setting of the initial state of the spin $\sigma_i$ and the solution reading after the completion of the ground-state search are performed through the SRAM compatible interface 30. In the Ising chip 13, the interaction coefficient $J_{i,j}$ and the external magnetic field coefficient $h_i$ for setting the Ising model to be searched for the ground state in the spin array 20 are also read and written through the SRAM compatible interface 30.

Therefore, the spin $\sigma_i$, the interaction coefficient $J_{i,j}$ and the external magnetic field coefficient $h_i$ of the spin array 20 are given addresses. In a case where the spin $\sigma_i$, the interaction coefficient $J_{i,j}$ or the external magnetic field coefficient $h_i$ is read and written from and into the Ising chip 13, the corresponding address is given from the controller 15 to the I/O address decoder 21 through the address bus 31, an R/W control signal for controlling the read and write of the spin $\sigma_i$, interaction coefficient $J_{i,j}$ and external magnetic field coefficient $h_i$ is given from the controller 15 to the I/O driver 22 through the R/W control line 33.

Thus, the I/O address decoder 21 activates the word line of the spin array 20 based on the address given through the address bus 31, and the I/O driver 22 drives the corresponding bit line in the spin array 20 based on the R/W control signal given through the R/W control line 33. Thus, the initial value of the spin $\sigma_i$ given through the data bus 32 and the setting values of the interaction coefficient $J_{i,j}$ and the external magnetic field coefficient $h_i$ are set in the spin array 20, or the solution after the completion of the ground-state search is read from the spin array 20 and output to the outside through the data bus 32.

In addition, the address bus 31, the data bus 32 and the R/W control line 33 constituting the SRAM compatible interface 30 operate in synchronization with the I/O clock supplied from the control unit 12 to the Ising chip 13 through the I/O clock line 34. However, in the present invention, it is not necessary that the interface is synchronous, and an asynchronous interface may be used. In the present embodiment, a description will be given assuming that it is a synchronous interface.

In addition, the Ising chip 13 implements the interaction between spins in the spin array 20 in order to perform the ground-state search. The interaction control interface 35 externally controls the interaction. Specifically, the Ising chip 13 receives an address designating a group of spins to interact with each other, which is given from the controller 15, through the interaction address line 36, and spins interact with each other in synchronism with the interaction clock from the interaction clock generator 16, which is input through the interaction clock line 37. The interaction address decoder 23 reads or writes the interaction coefficient $J_{i,j}$ and the external magnetic field coefficient $h_i$ from or to the spin array 20 based on the address given through the interaction address line 36.

In addition, the Ising chip 13 has a random number injection line 38 for injecting a random number to stochastically invert data readout from the memory in the spin array 20 or a result of performing a predetermined operation on the data as described later. The random number generated by the random number generator 17 described above with reference to FIG. 2 is given to the spin array 20 through the random number injection line 38.

The inter-chip connection unit 24 functions as an interface for transmitting and receiving necessary value of spin $\sigma_i$ to and from the adjacent Ising chips 13.

<<(3-3) Configuration of Spin Array>>

The configuration of the spin array will be described with reference to FIG. 4. FIG. 4 is a conceptual diagram illustrating an example of a configuration of a spin array of a three-dimensional lattice, in Embodiment 1.

The spin unit implements retaining of one spin $\sigma_i$ and its associated interaction coefficient $J_{i,j}$ and external magnetic field coefficient $h_i$ and a ground-state search operation. The spin array 20 is configured by arranging a large number of spin units, with the spin unit as a basic configuration unit.

FIG. 4 shows an example in which a plurality of spin units are arranged to construct an Ising model having a three-dimensional lattice topology. The example in FIG. 4 is a three-dimensional lattice having a size of 3 (X-axis direction)×3 (Y-axis direction)×2 (Z-axis direction). The coordinate axes are defined as shown in FIG. 4, the X axis is the right direction of FIG. 4, the Y axis is the downward direction of FIG. 4, and the Z axis is the depth direction of FIG. 4. However, the coordinate axes are only necessary for the convenience of description of the embodiment, and are not related to the present invention. In the case of using a topology other than the three-dimensional lattice, for example, a tree-like topology, it is expressed by the number of stages of the tree or the like separately from the coordinate axis. In the three-dimensional lattice topology of FIG. 4, if the interaction between spins is obtained as a graph, a five-order-of spin (vertex) is required at maximum. Incidentally, considering the connection of the external magnetic field coefficient, the order six is required at the maximum.

The values of adjacent spins (for example, $\sigma_1$, $\sigma_2$, $\sigma_3$, $\sigma_4$, and $\sigma_5$ in the case of five adjacent spins) are input to a single spin unit 40 shown in FIG. 4. Therefore, the spin unit 40 has a memory cell for retaining the values of the adjacent spins to be input. The spin unit 40 includes a memory cell that retains the external magnetic field coefficients and the interaction coefficients with the adjacent spins (the interaction coefficients with five adjacent spins $J_{i,1}$, $J_{i,2}$, $J_{i,3}$, $J_{i,4}$, and $J_{i,5}$), in addition to such spin values, respectively.

<<(3-4) Configuration of Spin Unit>>

The configuration of the spin unit will be described with reference to FIGS. 5 to 9. FIG. 5 and FIG. 6 are conceptual diagrams for explaining the configuration of the spin array in Embodiment 1. FIG. 7 and FIG. 8 are block diagrams showing an example of the configuration of the spin unit in Embodiment 1. FIG. 9 is a block diagram showing an example of an arrangement of the spin unit on the Ising chip, in Embodiment 1.

One configuration example of the spin unit 40 will be described with reference to FIG. 7 and FIG. 8. The spin unit 40 has two sides, and for the sake of convenience, it will be described separately in FIG. 7 and FIG. 8, but a single spin unit 40 includes both the configurations of FIGS. 7 and 8.

FIG. 7 shows a circuit for implementing the interaction between the spin units 40. As shown in FIG. 7, the spin unit 40 includes a circuit block 46, an exclusive OR (XOR circuit 48, a majority circuit 44, a selector 43, and a memory cell N. The circuit block 46 is provided with memory cells H[u] and $J_k$[u] (0≤u≤1, 1≤k≤5) and a negation of exclusive OR (XNOR) circuit 45. The XNOR circuit 45 is composed of a plurality of XNOR gates. The circuit block 46 also includes a plurality of XNOR gates connected between the memory cell $J_k$[u] (0≤u≤1, 1≤k≤5) and the XNOR circuit 45. The XOR circuit 48 is composed of a plurality of XOR gates.

In the spin unit 40 shown in FIG. 7, for example, in the memory cell H [u] (0≤u≤1), the memory cell H[0] is connected to one input of the XNOR gate of the XNOR circuit 45, and H[1] is connected to the other input of the XNOR gate of the XNOR circuit 45. The output of the XNOR gate of the XNOR circuit 45 is connected to one input of the XOR gate of the XOR circuit 48, and the random number signal line 49 is connected to the other input of the XOR gate of the XOR circuit 48. The memory cell H[0] is directly connected to one input of another XOR gate of the XOR circuit 48, and another random number signal line 49 is connected to the other input of another XOR gate of the XOR circuit 48.

Further, in the memory cell $J_1$[u] (0≤u≤1), the signal line $N_1$ of the spin value from another spin unit and the memory cell $J_1$[0] are connected to the respective inputs of the XNOR gate between the memory cell $J_1$[0] and the XNOR circuit 45. The output of the XNOR gate between the memory cell $J_1$[0] and the XNOR circuit 45 is connected to one input of the XNOR gate of the XNOR circuit 45, and the memory cell $J_1$[1] is connected to the other input of the XNOR gate of the XNOR circuit 45. The output of the XNOR gate of the XNOR circuit 45 is connected to one input of the XOR gate of the XOR circuit 48, and the random number signal line 49 is connected to the other input of the XOR gate of the XOR circuit 48. The output of the XNOR gate between the memory cell $J_1$[0] and the XNOR circuit 45 is directly connected to one input of another XOR gate of the XOR circuit 48, and another random number signal line 49 is connected to the other input of the XOR gate of the XOR circuit 48.

Even in other memory cells $J_2$[u], $J_3$[u], $J_4$[u], and $J_5$[u] (0≤u≤1), connection similar to the above memory cell $J_1$[u] (0≤u≤1) is made. In the spin unit 40 shown in FIG. 7, 12 random number signal lines 49 are formed corresponding to 12 XOR gates of the XOR circuit 48.

The output of the XOR circuit 48 is input to the majority circuit 44. A random number signal line 50 is connected to the majority circuit 44. The output of the majority circuit 44 is connected to one input of the selector 43, and the output of the memory cell N is connected to the other input of the selector 43. A signal line EN of a switching signal for permitting updating of the spin of the spin unit 40 is connected to the selector 43. The output of the selector 43 is connected to the input of the memory cell N, and the output of the memory cell N is connected to the signal line ON through which the value of the spin of the spin unit 40 is output to the other spin unit 40.

FIG. 8 illustrates the configuration of the spin unit 40, focusing on the bit line 41 and the word line 42 which are interfaces for accessing the memory cells N, H[u], and $J_k$[u] (0≤u≤1, 1≤k≤5) included in the spin unit 40 from outside the Ising chip 13.

In order to retain the spin $\sigma_i$, the interaction coefficient $J_{i,k}$ (1≤k≤5) and the external magnetic field coefficient $h_i$ of the Ising model, the spin unit 40 includes a plurality of one bit memory cells N, H[u], and $J_k$[u] (0≤u≤1, 1≤k≤5). In addition, the memory cells H[0] and H[1], the memory cells $J_1$[0] and $J_1$[1], the memory cells $J_2$[0] and $J_2$[1] the memory cells $J_3$[0] and $J_3$[1] the memory cells $J_4$[4] and $J_4$[1], and the memory cells $J_5$[0] and $J_5$[1] respectively play a role in pairs, so that these are collectively abbreviated as memory cell pairs Hx, $J_1$x, $J_2$x, $J_3$x, $J_4$x or $J_5$x (see FIG. 5).

Here, the spin unit 40 will be described as representing the i-th spin. The memory cell N is a memory cell for expressing spin, and retains the value of spin. In the Ising model, the spin values are +1 and −1 (+1 is expressed by up and −1 is expressed by down), but the values correspond to binary values 0 and 1 that the memory cell can retain. For example, +1 corresponds to 1, and −1 corresponds to 0.

FIG. 5 shows the correspondence between the memory cell pairs Hx and $J_k$x ($1 \leq k \leq 5$) included in the spin unit 40 and the topology of the Ising model shown in FIG. 4. The memory cell pair Hx stores the external magnetic field coefficient. Further, the memory cell pair $J_k$x ($1 \leq k \leq 5$) stores interaction coefficients, respectively. Specifically, the memory cell pair $J_1$x stores the interaction coefficient with the upper spin (−1 in the Y-axis direction), the memory cell pair $J_2$x stores the interaction coefficient with the left spin (−1 in the X-axis direction), the memory cell pair $J_3$x stores the interaction coefficient with the right spin (+1 in the X-axis direction), the memory cell pair $J_4$x stores the interaction coefficient with the lower spin (+1 in the Y-axis direction), the memory cell pair $J_5$x stores the interaction coefficient with the spin (+1 or −1 in the Z-axis direction) connected in the depth direction, respectively.

In a case where the Ising model is represented as a directed graph, a certain spin has a coefficient of influence of other spins on the certain spin. A coefficient of influence of the certain spin on other spins belongs to other spins, respectively. That is, the spin unit 40 is connected to five spins at maximum. In the Ising chip 13 of the present embodiment, the external magnetic field coefficient and the interaction coefficient correspond to three values of +1, 0, and −1. Therefore, in order to express the external magnetic field coefficient and the interaction coefficient, 2-bit memory cells are required.

The memory cells H[0] and $J_k$[0] ($1 \leq k \leq 5$) are 1 when the respective corresponding coefficients are positive, and are 0 when the corresponding coefficients are 0 or less. The memory cells H[1] and $J_k$[1] are 1 when the absolute values of the respective corresponding coefficients are 1, and are 0 when the absolute values are 0. For example, H [0]=0 and H [1]=1 when the external magnetic field coefficient retained by the spin cell is −1.

The memory cells N, H[u], and $J_k$[u] ($0 \leq u \leq 1$, $1 \leq i \leq 5$) in the spin unit 40 need to be readable and writable from the outside of the Ising chip 13. For this, as shown in FIG. 8, the spin unit 40 has a bit line 41 and a word line 42.

In the Ising chip 13, as shown in FIG. 9, spin units 40 are arranged in a tile pattern on a semiconductor substrate and the bit lines 41 and the word lines 42 are connected thereto, and the I/O address decoder 21 and the I/O driver 22 drive, control or read the spin units 40 so that the memory cells in the spin unit 40 can be read and written by the SRAM compatible interface 30 of the Ising chip 13 similarly to a general static random access memory (SRAM).

In addition, which vertex in the topology of the three-dimensional lattice the spin unit (signed according to the position on the X-axis, Y-axis and Z-axis like Nxyz) shown in FIG. 9 corresponds to is shown in FIG. 6. In order to dispose the 3×3×2 three-dimensional lattice vertices on the two-dimensional plane, it is disposed to insert each lattice vertex of the lattice vertex array in the Z-axis direction in the interval of the lattice vertex array in the X axis direction. That is, the three-dimensional lattice is disposed like Nx0z, Nx1z, and Nx2z in the Y-axis direction on the two-dimensional plane in FIG. 9 (the lower side in FIG. 9 is the positive direction of the Y-axis), but spin units with Z-axis direction coordinates 0 and 1 are alternately disposed like N0y0, N0y1, N1y0, N1y1, N2y0, and N2y1 in the X-axis direction (the right side in FIG. 9 is the positive direction of the X-axis direction).

In addition, the spin unit 40 independently has a circuit for calculating the interaction and determining the state of the next spin for each spin unit 40, in order to perform updating at the same time. In FIG. 7, the spin unit 40 has a signal line EN, $N_k$ ($1 \leq k \leq 5$), ON and RND (49, 50), as an interface with the outside. The signal line EN is an interface that inputs a switching signal for permitting updating of the spin of the spin unit 40. By controlling the selector 43 with the switching signal, it is possible to update the value of the spin retained in the memory cell N to a value given to the selector 43 from the majority circuit 44 described later.

The signal line ON is an interface that outputs the value of the spin of the spin unit 40 to another spin unit 40 (a unit adjacent in the topology of FIG. 4). The signal line $N_k$ ($1 \leq k \leq 5$) is an interface for inputting the spin value retained by each different spin unit 40 (an adjacent unit in the topology of FIG. 4). The signal line $N_1$ is the input from the upper spin (−1 in the Y-axis direction), the signal line $N_2$ is the input from the left spin (−1 in the X-axis direction), the signal line $N_3$ is the input from the right spin (+1 in the X-axis direction), the signal line $N_4$ is the input from the lower spin (+1 in the Y-axis direction), the signal line $N_5$ is the input from the spin (+1 or −1 in the Z-axis direction) connected in the depth direction, respectively.

The signal line RND (49) is a random number signal line (hereinafter also referred to as an RND line) and is provided in the preceding stage of the majority circuit 44, and the value of a predetermined signal to be input to the majority circuit 44 is stochastically inverted based on the random number signal applied from the RND line 49. Further, the signal line RND (50) is the RND line for input to the majority circuit 44. These RND lines 49 and 50 are connected through a random number injection line 38 (FIG. 3) to a random number generator 17 (FIG. 2) which generates a random number signal.

In the present embodiment, the memory cells H[u] and $J_k$[u] ($0 \leq u \leq 1$, $1 \leq k \leq 5$) correspond to a memory in the present invention. Further, the circuit block 46 excluding these memory cells corresponds to a reading unit which reads data from the memory in the present invention. Further, the majority circuit 44 corresponds to the majority circuit that inputs a result of a predetermined operation on the data read by the reading unit in the present invention. The selector 43 corresponds to the write circuit which inputs the output of the majority circuit in the present invention. Further, in the present invention, the control unit that controls the memory, the reading unit, the majority circuit and the write circuit corresponds to the control unit 12 shown in FIG. 2.

<<(3-5) Realization of Non-Linear Operation Using Majority Circuit and Random Number>>

The realization of the non-linear operation using the majority circuit and the random number will be described with reference to FIGS. 10, 11, 12A, 12B, 13A and 13B in addition to FIG. 7 described above. FIG. 10 is a diagram of the Ising model for explaining the spin unit shown in FIG. 7, in Embodiment 1. FIG. 11 is a block diagram in which one place of the spin unit shown in FIG. 7 is extracted, in Embodiment 1. FIG. 12A and FIG. 12B are conceptual diagrams for explaining a calculation result by coefficients and spin values, in Embodiment 1. FIG. 13A and FIG. 13B are diagrams for explaining a random number to be injected into the spin unit, in Embodiment 1.

The spin unit 40 stochastically determines the next state of spin by the value of the adjacent spin. With reference to FIG. 7, FIG. 10, FIG. 11, FIG. 12A, FIG. 12B, FIG. 13A and FIG. 13B, a circuit configuration for realizing the SA method based on the thermal bath method and a control method of a random number will be described.

When the spin expressed by spin unit 40 is inverted from the current value, the energy increases by ΔH calculated by the following expression.

[Expression 4]

$$\Delta H = H(\sigma') - H(\sigma) = 2\sigma_i(h_i + \Sigma_{1 \leq k \leq 5} J_{ik}\sigma_k) \quad (4)$$

In a case where the value of the i-th spin after the stochastic transition is 1, either $\sigma_i=+1$ and the spin is not inverted in the current state, or $\sigma_i=-1$ and the spin is inverted in the current state. The probabilities $p_1$ and $p_2$ that occur respectively are as the following expression.

[Expression 5]

$$p_1 = 1 - \frac{1}{2}\left\{1 + \tanh\left(-\frac{\Delta H}{T}\right)\right\} = \frac{1}{2}\left\{1 + \tanh\left(\frac{\Delta H}{T\sigma_i}\right)\right\} \quad (5)$$

[Expression 6]

$$p_2 = \frac{1}{2}\left\{1 + \tanh\left(-\frac{\Delta H}{T}\right)\right\} = \frac{1}{2}\left\{1 + \tanh\left(\frac{\Delta H}{T\sigma_i}\right)\right\} \quad (6)$$

If Expression (4) is substituted for each probability shown in expressions (5) and (6), both become $p_+$ of the following expression.

[Expression 7]

$$p_+ = \frac{1}{2}\left\{1 + \tanh\left(\frac{\Delta H}{T\sigma_i}\right)\right\} = \frac{1}{2}\left\{1 + \tanh\left(\frac{2\left(h_i + \sum_{1 \leq k \leq 5} J_{ik}\sigma_k\right)}{T}\right)\right\} \quad (7)$$

That is, when the spin is stochastically inverted according to the thermal bath method, the probability that the inverted value becomes 1 does not depend on the value before transition and is always $p_+$. Therefore, when updating the spin stochastically by the thermal bath method, 1 may be written with probability $p_+$ into the memory cell N through the selector 43. This corresponds to the majority circuit 44 outputting 1 with probability $p_+$.

The circuit block 46 in the spin unit 40 is shown in FIG. 11. The circuit block 46 is composed of memory cells H[u] and $J_k[u]$ (0≤u≤1, 1≤k≤5) representing a signal line $N_k$ for reading the values of adjacent spins and coefficients, and an XNOR circuit 45. When the value of the adjacent spin is +1, the signal line $N_k$ is 1; and when the value of the spin is −1, the signal line $N_k$ is 0. The XNOR circuit 45 is composed of a plurality of XNOR gates. The circuit block 46 also includes a plurality of XNOR gates connected between the memory cell $J_k[u]$ (0≤u≤1, 1≤k≤5) and the XNOR circuit 45. The value of signal output from the circuit block 46 is expressed by H'[u], $J'_k[u]$ (0≤u≤1, 1≤k≤5).

If H'[0] and H'[1] are calculated for each case where the external magnetic field coefficient $h_i$ is +1, 0, or −1, it is as shown in the table shown in FIG. 12A. For example, in a case where $h_i$ is 1, H[0] is 1, and H[1] is 1, H'[0] is 1, and H'[1] is 1. Others are as shown in FIG. 12A. Assuming that in H'[0] and H'[1], the number of values 1 is $NH_+$, and the number of values 0 is $NH_-$, the following expression holds.

[Expression 8]

$$2h_i = NH_+ - NH_- \quad (8)$$

Similarly, for each case where the interaction coefficient $J_{i,k}$ (1≤k≤5) is +1, 0, or −1 and the adjacent spin value $\sigma_k$ to be read with signal line $N_k$ is +1 or −1, $J'_k[0]$ and $J'_k[1]$ are calculated. Then, it is as shown in the table shown in FIG. 12B. For example, in a case where $\sigma_k$ is 1, $N_k$ is 1, $J_{i,k}$ is 1, $J_k[0]$ is 1, and $J_k[1]$ is 1, $J'_k[0]$ is 1 and $J'_k[1]$ is 1. Others are as shown in FIG. 12B. Assuming that in $J'_k[0]$, and $J'_k[1]$, the number of values 1 is $NJ_{k,+}$, and the number of values 0 is $NJ_{k,-}$, the following expression holds.

[Expression 9]

$$2J_{ik}\sigma_k = NJ_{k,+} - NJ_{k,-} \quad (9)$$

From Expressions (8) and (9), the following expression holds.

[Expression 10]

$$2(\Sigma_{1 \leq k \leq 5} J_{ik}\sigma_k + h_i) = (NH_+ - NH_-) + \Sigma_{1 \leq k \leq 5}(NJ_{k,+} - NJ_{k,-}) \quad (10)$$

The right side of Expression (10) represents the difference between the number $n_+$ of signals having a value of 1 and the number $n_-$ of signals having a value of 0 in the signals output from the circuit block 46. Then, the following expression holds.

[Expression 11]

$$2(\Sigma_{1 \leq k \leq 5} J_{ik}\sigma_k + h_i) = n_+ - n_- \quad (11)$$

Using Expression (11), the probability $p_+$ shown in Expression (7) is expressed as follows.

[Expression 12]

$$p_+ = \frac{1}{2}\left\{1 + \tanh\left(\frac{n_+ - n_-}{T}\right)\right\} \quad (12)$$

Expression (12) can be expressed by the probability f(x, T) given by the following function including the hyperbolic tangent function whose argument is the value x $(=n_+-n_-)$ using the parameter T.

[Expression 13]

$$f(x, T) = \frac{1}{2}\left\{1 + \tanh\left(\frac{x}{T}\right)\right\} \quad (13)$$

For the cumulative distribution function of the standard normal distribution and the hyperbolic tangent function, the following approximate expression is known.

[Expression 14]

$$\int_{-\infty}^{x} \frac{1}{\sqrt{2\pi}} \exp\left(-\frac{t^2}{2}\right) dt \approx \frac{1}{2}\left\{1 + \tanh\left(\sqrt{\frac{2}{\pi}} x\right)\right\} \quad (14)$$

From the approximate expression and Expression (12), the probability $p_+$ can be approximated as follows.

[Expression 15]

$$p_+ \approx \int_{-\infty}^{\sqrt{\frac{\pi}{2}} \frac{n_+ - n_-}{T}} \frac{1}{\sqrt{2\pi}} \exp\left(-\frac{t^2}{2}\right) dt \quad (15)$$

From the above, the majority circuit 44 may output 1 with the probability $p_+$ expressed by Expression (15).

In the present embodiment, each signal output from the circuit block 46 is stochastically inverted by using the RND line (random number signal line) 49 and the XOR circuit 48. The RND line 49 is applied with a random number which is 1 with probability p and 0 with probability 1−p, and the random numbers are independent of each other. FIG. 13A shows how the random number is applied to three RND lines 49 with p=0.25. In the example of FIG. 13A, for example, the random number applied to the first RND line 49 is a signal at which the 2nd, 8th, 13th, 19th and 20th clocks of the 20 clocks are high level. Further, the second RND line 49 is a signal at which the 3rd, 6th, 10th, 12th and 19th clocks are high level, and the third RND line 49 is a signal at which the 1st, 4th, 10th, 13th and 14th clocks are high level. The ratio of the high level of both RND lines 49 is 5/20=0.25, and the probability p=0.25 is realized. In order to supply a temporally random number to the XOR circuit 48, the random number clock width needs to be the interaction clock width or less. FIG. 13A shows an example in which the random number clock width and the interaction clock width are equal.

When the signal which is the output of the circuit block 46 is 1, the output of the XOR circuit 48 which receives the signal and the RND line 49 as an input is 1 with the probability 1−p, and 0 with the probability p. When the signal which is the output of the circuit block 46 is 0, the output of the XOR circuit 48 which has the signal and the RND line 49 as an input is 1 with the probability p and 0 with the probability 1−p. Therefore, at the output of the XOR circuit 48, the number Z of signal lines of 1 follows the normal distribution of average $n_+(1-p)+n_- p$ and variance $(n_+ + n_-)p(1-p)$.

L represents the number of coefficients of an Ising model represented by memory cells in the spin unit 40. For example, the spin unit 40 representing the spin $\sigma_i$ shown in FIG. 10 is L=6 to represent five interaction coefficients and one external magnetic field coefficient. Since $2L=n_+ + n_-$, Z is said to follow the normal distribution of average $n_+(1-p)+n_- p$ and variance $2Lp(1-p)$.

There are 2L XOR circuits 48. When the number of signals of 1 and the number of signals of 0 at the output of the XOR circuit 48 are equal, that is, when Z=L, 1 or 0 needs to be the result of majority decision with equal probability. This is realized by adding the RND line 50 to the input of the majority circuit 44. However, a random number of 1 with a probability of 0.5 and 0 with a probability of 0.5 is applied to the RND line 50. FIG. 13B shows how the random number is applied to the RND line 50. In the example of FIG. 13B, the random number applied to the RND line 50 is a signal at which the 3rd, 4th, 8th, 9th, 10th, 14th, 15th, 16th, 18th, and 19th clocks of the 20 clocks are high level. The ratio of the high level of the RND line 50 is 10/20=0.5, and the probability of 0.5 is realized.

When the number of signals of 1 and the number of signals of 0 at the output of the XOR circuit 48 are different, that is, when Z≠L, the value to be output by the majority circuit 44 is not inverted by the RND line 50.

The majority circuit 44 outputs 1 with the probability $q_+$ calculated by the following expression.

[Expression 16]

$$q_+ = \int_L^\infty \frac{1}{\sqrt{2\pi \cdot 2Lp(1-p)}} \exp\left(-\frac{\{t-(n_+(1-p)+n_- p)\}^2}{2 \cdot 2Lp(1-p)}\right) dt \quad (16)$$

$$= \int_{-\infty}^{\frac{-L+n_+(1-p)+n_- p}{\sqrt{2Lp(1-p)}}} \frac{1}{\sqrt{2\pi}} \exp\left(-\frac{t^2}{2}\right) dt$$

The condition that the probability $q_+$ and the probability $p_+$ are approximate values at arbitrary $n_+$, $n_-$ is expressed by the following expression.

[Expression 17]

$$\sqrt{\frac{\pi}{2}} \frac{n_+ - n_-}{T} = \frac{-L + n_+(1-p) + n_- p}{\sqrt{2Lp(1-p)}} \quad (17)$$

From Expression (17), the following expression holds for the parameter T of the SA method and the probability p.

[Expression 18]

$$p = \frac{1}{2}\left(1 - \frac{1}{\sqrt{1 + \frac{T^2}{\pi L}}}\right) \quad (18)$$

In the initial state of the SA method, the parameter T is set to a large value, and T is gradually decreased as the transition between the states is repeated. Applying this to the above expressions, it corresponds to a case where p=½ at the beginning of the SA method and p is gradually decreased to p=0.

(4) Control Procedure of Ising Chip

The control procedure of the Ising chip will be described with reference to FIG. 14, FIG. 15A and FIG. 15B. FIG. 14 is a flowchart showing a processing procedure of a ground-state search process, in Embodiment 1. FIG. 15A and FIG. 15B are diagrams for explaining control methods of a random number to be injected into the spin unit, in Embodiment 1.

FIG. 14 shows the processing procedure of the ground-state search process executed by the CPU 3 (FIG. 1) in the information processing device 1 of the present embodiment. The CPU 3 controls the Ising chips 13 in the corresponding multi-Ising chip 6 through the controller 15 (FIG. 2) of a necessary multi-Ising chip 6 (FIG. 2), based on the problem conversion program 8 (FIG. 1) for step SP1, and based on the multi-Ising chip control program 9 (FIG. 1) for the subsequent processes (step SP2 to step SP11), thereby causing the Ising chips 13 to execute the ground-state search. In addition, the process of step SP1 and the processes of step SP2 to step SP11 may be executed at different timings.

Further, the CPU 3 controls the Ising chip 13 in each multi-Ising chip 6 and the spin units 40 in the Ising chip 13 through the controller 15 (FIG. 2) in the multi-Ising chip 6, but in the following, for ease of understanding, a description will be given by omitting the existence of the controller 15.

When starting the ground-state search process in response to an instruction or the like from the user, the CPU 3 first converts the problem data 7 (FIG. 1) into data of the Ising model format (step SP1). If the problem data 7 is already data of the Ising model format, step SP1 is omitted.

Subsequently, the CPU 3 sets the converted interaction coefficient and external magnetic field coefficient of the Ising model to each spin unit 40 in each Ising chip 13 of the necessary multi-Ising chip 6 (step SP2).

Next, the CPU 3 determines the value of the spin to be retained by each spin unit by random number, and initializes the value of the spin of each spin unit 40 in each Ising chip 13 in the multi-Ising chip 6 such that it becomes the determined spin value (step SP3).

Furthermore, the CPU 3 sets the probability (hereinafter, referred to as "bit probability") that "1" appears in each random number supplied to the RND line 49 from the random number generator 17 (FIG. 2) in each predetermined multi-Ising chip (step SP4). The bit probability corresponds to the aforementioned probability p.

The procedure of step SP4 will be described in detail. In the existing study on the SA method, temperature scheduling including the following has been proposed in order to obtain a solution sufficiently close to the optimal solution.

[Expression 19]

$$T_k = \frac{C}{\log(k+1)} \quad (19)$$

[Expression 20]

$$T_{k+1} = \alpha T_k \quad (20)$$

$T_k$ is the k-th value when the parameter T is gradually lowered. The value of the parameter T at the start of the SA method is $T_0$. C is a sufficiently large constant, and $\alpha$ is a constant satisfying $0<\alpha<1$. In step SP4, first, the CPU 3 calculates $T_k$ (k=0, 1, 2, . . . ) using temperature scheduling such as Expressions (19) and (20). Next, using Expression (18), each bit probability corresponding to executing the thermal bath method with each parameter $T_k$ is obtained. Then, at the end of step SP4, each bit probability in each of the aforementioned stages is set.

In the case of the present embodiment, the bit probability is set to about 0.5 at the start, and thereafter, the bit probability is lowered stepwise. Thus, the value of the spin retained by each spin unit 40 is stochastically inverted based on the thermal bath method.

FIG. 15A shows $T_k$ (0≤k<40) when the temperature scheduling is determined by the Expression (20) with $T_0$=100 and $\alpha$=0.9. In FIG. 15A, step k (k=0 to 40) is taken on the horizontal axis and parameter T (T=0 to 100) is taken on the vertical axis. When L=6, the bit probability p is calculated using Expression (18) at each temperature, as shown in FIG. 15B. In FIG. 15B, step k (k=0 to 40) is taken on the horizontal axis and bit probability p (p=0.0 to 0.5) is taken on the vertical axis.

When the bit probability is 0.5, that is, when a random number of 1 with a probability of 0.5 is applied to each signal of the RND line 49, the XOR circuit 48 outputs 1 with a probability of 0.5, respectively. Therefore, the majority circuit 44 outputs 1 with a probability of 0.5, and 0 or 1 is randomly written to the memory cell N. Accordingly, in a case where the spin value is initialized randomly in step SP3, step SP3 can be omitted by executing bit probability 0.5 in step SP4.

Further, the CPU 3 sets the number of times of executing the interaction calculation for each predetermined bit probability (step SP5).

Subsequently, the CPU 3 drives the interaction clock generator 16 (FIG. 2) of the multi-Ising chip 6 to execute the interaction calculation in each spin unit 40 in each Ising chip 13 once (step SP6) After that, the CPU 3 determines whether or not the interaction operation has been executed for the number of times set for the current bit probability (step SP7). When obtaining a negative result in this determination, the CPU 3 returns to step SP6, and thereafter repeats the processes of step SP6 and step SP7.

Then, if the CPU 3 eventually obtains a positive result in step SP7 by executing an interaction operation for the number of times set for the currently set bit probability, the CPU 3 determines whether all interaction operations for each bit probability set in step SP5 have been executed (step SP8).

If a negative result is obtained in the determination, the CPU 3 updates the bit probability to a predetermined bit probability lower than the current bit probability (step SP9), and also updates the number of interaction operations to be executed thereafter to a predetermined number of times for the bit probability (step SP10). Then, the CPU 3 returns to step SP6, and thereafter repeats the processes from step SP6 to step SP10.

Then, if the CPU 3 eventually obtains a positive result in step SP8 by completing the execution of all the interaction operations for each bit probability set in step SP5, the CPU 3 reads out the spin value retained by each spin unit 40 in each Ising chip 13 in the targeted multi-Ising chip 6 at that time (step SP11).

Thereafter, the CPU 3 ends the ground-state search process. As described above, the ground-state search process can be executed.

(5) Effects of Embodiment 1

According to the semiconductor device and the information processing device of Embodiment 1 described above, they can be manufactured easily at low cost and it is possible to calculate an arbitrary interaction model such as an Ising model. That is, according to the information processing device of Embodiment 1, by inverting the signal stochastically in the pre-processing stage of the majority circuit 44, it is possible to execute stochastic state transition given by a nonlinear function that is required in an SA method based on the thermal bath method, without using an adder, a multiplier, or the like. Thus, an information processing device capable of accurately obtaining the ground state of the Ising model or an approximate solution of the ground state can be manufactured inexpensively and easily. More specifically, it is as follows.

(1) The semiconductor device includes memory cells H[u] and $J_k[U]$ (0≤u≤1, 1≤k≤5), a circuit block 46 that reads data from the memory cells H [u] and $J_k[u]$, a majority circuit 44 that inputs a result of a predetermined operation on the data read by the circuit block 46, and a selector 43 that inputs the output of the majority circuit 44. In the preceding stage of the majority circuit 44, the value of a predetermined signal is stochastically inverted. This enables a stochastic process based on a nonlinear function without calculating the nonlinear function using an adder or a multiplier. In particular, the majority circuit 44 has an advantage that the circuit area can be reduced by implementing an analog circuit or the like.

(2) In the semiconductor device, by supplying the random number signal line 49 to the preceding stage of the majority circuit 44, the value of a predetermined signal to be input to the majority circuit 44 can be stochastically inverted, based on the random number signal applied from the random number signal line 49.

(3) The semiconductor device includes a control unit 12 that controls the memory cells H[u] and $J_k[u]$ ($0 \le u \le 1$, $1 \le k \le 5$), the circuit block 46, the majority circuit 44 and the selector 43. The control unit 12 has a step of calculation using the parameter T determined by the control unit 12 regardless of the values of the memory cells H[u] and $J_k[u]$. In this step, based on the calculation result, the value of the predetermined signal in the semiconductor device is stochastically inverted and "1" is randomly output with the probability f(x, T) given by the function of Expression (13) including the hyperbolic tangent function whose argument is the value x determined by the values of the memory cells H[u] and $J_k[u]$. Thus, by calculating and controlling probability of "1" randomly to be applied to the random number signal line 49, a desired stochastic process can be realized.

(4) The semiconductor device can be applied to a semiconductor device which performs a non-linear operation. Further, another semiconductor device can be applied to a semiconductor device which calculates an interaction model. More specifically, it can be applied to a semiconductor device which calculates a ground state which is a spin arrangement which minimizes the energy of the Ising model or calculates an approximate solution of the ground state as a solution to a problem.

(5) In the semiconductor device, in a case where the number of interactions between spins is L, the control unit 12 supplies the random number signal line 49 with a random signal which is "1", with a probability p calculated by Expression (18) using a parameter T determined by the control unit 12. Thus, by calculating and controlling probability of "1" randomly to be applied to the random number signal line 49, a desired stochastic process can be realized.

(6) According to the present embodiment, a stochastic process based on a nonlinear function required in an SA method or the like which is an algorithm for solving an optimization problem can be realized while suppressing an increase in a circuit size by excluding the adder, the multiplier, or the like. That is, with a configuration utilizing the majority circuit 44 instead of the adder, the multiplier, or the like, it is possible to realize the equivalent function with reduced circuit scale compared to the case using an adder, a multiplier, or the like. Furthermore, realization of the stochastic process based on a nonlinear function enables ground-state search of Ising model by an SA method based on a thermal bath method.

Embodiment 2

In the above described Embodiment 1, the case where different random number signal lines (RND lines) 49 are provided in the inputs of the respective XOR gates of the XOR circuit 48 has been described in detail. However, when the random number clock width is sufficiently small, it is possible to reduce the number of RND lines 49.

Embodiment 2 is an example applied to a semiconductor device and an information processing device capable of reducing the number of RND lines, and those different from the above-described Embodiment 1 will be mainly described with reference to FIGS. 16 and 17. FIG. 16 is a block diagram showing an example of a configuration of a spin unit of Embodiment 2. FIG. 17 is a diagram for explaining a random number to be injected into the spin unit, in Embodiment 2.

FIG. 16 shows a circuit configuration in a case where the RND line 51 is integrated into one. The one RND line 51 is connected to one input of each XOR gate of the XOR circuit 48. The output of the circuit block 46 is connected to the other input of each XOR gate of the XOR circuit 48. The values of signals at each place shown in FIG. 16 are represented by $S_0$ and $S_1$. As the random number signals injected into the RND line 51, $S_0$ and $S_1$ are propagated in order with a delay (see FIG. 17). If the random number clock width is less than or equal to the delay time between $S_0$ and $S_1$, the random numbers in $S_0$ and $S_1$ are independent from each other at a certain time. FIG. 17 shows an example in which the delay time corresponds to two clocks of the random number clock width.

In addition, the number of RND lines 51 is one in FIG. 16. However, the number of RND lines 51 may be appropriately set by comparing the delay time of the random number and the random number clock width.

According to the semiconductor device and the information processing device of Embodiment 2 described above, it is possible to reduce the number of RND lines 51 when the random number clock width is sufficiently small, as an effect different from the above-described Embodiment 1.

Embodiment 3

In the above-described Embodiments 1 and 2, the circuit configuration in the case where the memory cell representing the coefficient of the spin unit 40 records the sign of each coefficient and the absolute value of the coefficient has been described in detail. However, by changing the coefficients given to the memory cells, the circuit of the circuit block 46 can be simplified.

Embodiment 3 is an example applied to a semiconductor device and an information processing device in which the circuit configuration of a circuit block in a spin unit is changed, and those different from the above-described Embodiments 1 and 2 will be mainly described with reference to FIG. 18. FIG. 18 is a block diagram showing an example of a configuration of a spin unit of Embodiment 3.

FIG. 18 is a configuration example in the case where each coefficient of the Ising model is given to a memory cell according to a different rule from the above-mentioned Embodiment 1. The memory cells H[0] and $J_k[0]$ ($1 \le k \le 5$) is 1 when the corresponding coefficient is positive, and is 0 when the corresponding coefficient is 0 or less. Further, the memory cell H[1] records the negation of exclusive OR of the absolute value of the external magnetic field coefficient and H[0]. Similarly, the memory cell $J_k[1]$ ($1 \le k \le 5$) records the negation of exclusive OR of the absolute value of the corresponding interaction coefficient and $J_k[0]$. For example, H[0]=0 and H[1]=0 when the external magnetic field coefficient retained by the spin cell is −1. At this time, similarly to the above-mentioned Embodiment 1, a stochastic state transition based on the thermal bath method is implemented.

In addition, in the spin unit 40 shown in FIG. 18, the circuit block 46 has a configuration different from that in FIG. 7 of the above-described Embodiment 1. For example, in the memory cell H[u] ($0 \le u \le 1$), the memory cell H[0] and the memory cell H[1] are directly connected to the XOR gates of XOR circuits 48.

Further the memory cell $J_1[u]$ ($0 \le u \le 1$) has two XNOR gates, and the signal line $N_1$ of the spin value from another spin unit is connected to one input of each of the two XNOR gates and the memory cell $J_1[0]$ and the memory cell $J_1[1]$ are connected to the other input of each of the two XNOR gates, respectively.

Even in other memory cells $J_2[u]$, $J_3[u]$, $J_4[u]$, and $J_5[u]$ ($0 \le u \le 1$), connection similar to the above memory cell $J_1[u]$ ($0 \le u \le 1$) is made. The output of the circuit block 46 is input to the XOR circuit 48. In the XOR circuit 48, a logical operation with the random number signal injected into the RND line 49 is performed in the same manner as in Embodiment 1.

According to the semiconductor device and the information processing device of Embodiment 3 described above, as an effect different form the above-described Embodiments 1 and 2, the circuit configuration of the circuit block 46 can be changed by changing the coefficients given to the memory cells H[u] and $J_k[u]$ ($0 \le u \le 1$, $1 \le k \le 5$), whereby the circuit of the circuit block 46 can be simplified.

Embodiment 4

In the above-described Embodiments 1 to 3, an XOR circuit 48 that receives the random number to be injected from the outside by the random number signal line (RND line) in the process one stage before the majority circuit 44 is disposed. However, the calculation may not be necessarily performed one stage before the majority circuit 44. That is, it is not limited to one stage before the majority circuit 44, but may be operated earlier than that.

Embodiment 4 is an example applied to a semiconductor device and an information processing device in which a place to be provided with the RND line in the spin unit is changed, and those different from the above-described Embodiments 1 to 3 will be mainly described with reference to FIG. 19. FIG. 19 is a block diagram showing an example of a configuration of a spin unit of Embodiment 4.

FIG. 19 shows a configuration example in which the RND line 49 is provided in a place different from the above-described Embodiment 3. This circuit calculates an exclusive OR of the random number injected from the outside by the RND line 49 and the value read from the memory cells H[u] and $J_k[u]$ ($0 \le u \le 1$, $1 \le k \le 5$). That is, the present embodiment has a circuit configuration in which the contents stored in the memory cells H[u] and $J_k[u]$ are stochastically inverted and read out.

For example, the memory cell H[u] ($0 \le u \le 1$) has two XOR gates, and the memory cell H[0] and the memory cell H[1] are respectively connected to the inputs of the two XOR gates, and the RND lines 49 are connected to the other input of each of the two XOR gates. The output of each of the two XOR gates is input to the majority circuit 44.

Further, the memory cell $J_1[u]$ ($0 \le u \le 1$) has two XOR gates and two XNOR gates. The RND line 49 is connected to one input of each of the two XOR gates, and the memory cell $J_1[0]$ and the memory cell $J_1[1]$ are connected to the other inputs of the two XOR gates, respectively. A signal line $N_1$ having a value of a spin from another spin unit is connected to one input of each of the two XNOR gates and the output of each of the two XOR gates is connected to the other input of each of the two XNOR gates. The output of each of the two XNOR gates is input to the majority circuit 44.

Even in other memory cells $J_2[u]$, $J_3[u]$, $J_4[u]$, and $J_5[u]$ ($0 \le u \le 1$), connection similar to the above memory cell $J_1[u]$ ($0 \le u \le 1$) is made. Then, in the majority circuit 44, calculations similar to the above-described Embodiment 1 are performed.

In the spin unit 40 shown in FIG. 19, when the RND line 49 is controlled in the same manner as in the above-described Embodiment 1, the logical operations represented by the circuit configuration shown in FIG. 18 and the circuit configuration shown in FIG. 19 are equivalent. In other words, as in the configuration example shown in FIG. 19, state transition based on the thermal bath method can be implemented even by using a circuit that stochastically inverts and reads out the stored contents from the memory cell.

According to the semiconductor device and the information processing device of Embodiment 4 described above, as an effect different from the above-described Embodiments 1 to 3, the calculation with the random number is not limited to one stage before the majority circuit 44, so that it is possible to change a place to be provided with the RND line 49 in the spin unit 40.

Other Embodiments

In the above-described Embodiments 1 to 4, the interaction coefficient of the Ising model and the external magnetic field coefficient are described as three values of +1, 0, and −1. However, it is clear that the coefficient width can be expanded by increasing the memory cell. It is also possible to assign a value to each memory cell in the manner of binary notation. For example, in a case where three memory cells of one bit is set as a set, seven values of +3, +2, +1, 0, −1, −2, and −3 are assigned. At this time, the calculation expression of probability p of 1 given to the RND line 49 is different from expression (18), but it is easily obtained in the same way as in the above-described discussion.

Further, although the Ising model has been described as a lattice structure, the present invention is applicable to any graph structure.

Furthermore, in the present invention, it is also possible to execute a Markov chain Monte Carlo method by keeping the parameter T of the SA method constant. Therefore, the present invention is also suitable for a semiconductor device which performs sampling by the Markov chain Monte Carlo method, that is, Monte Carlo simulation of Ising model. Furthermore, a stochastic process based on a non-linear operation (function including a hyperbolic tangent function) that obtains a transition probability of a thermal bath method is also required in the neural network. Therefore, it is applicable to a semiconductor device which executes a process of a neural network.

As described above, the present invention is not limited to the representative Ising model in the world of physics, but can be applied to general interaction models capable of expressing various physical phenomena and social phenomena.

Hitherto, the invention made by the present inventors has been specifically described based on the embodiments, but the present invention is not limited to the embodiments, and various modifications are possible within a scope without departing from the spirit.

For example, the afore-mentioned embodiments have been described in detail in order to explain the present invention in an easy-to-understand manner and are not necessarily limited to those having all the configurations described. In addition, some of the configurations of certain embodiments may be replaced with the configuration of the other embodiments, and it is also possible to add configurations of other embodiments to the configurations of certain embodiments. Further, with respect to a part of the configuration of the embodiments, addition, deletion, and replacement of other configurations can be performed.

REFERENCE SIGNS LIST

1 INFORMATION PROCESSING DEVICE
2 SYSTEM BUS
3 CPU
4 MEMORY
5 STORAGE DEVICE
6 MULTI-ISING CHIP
7 PROBLEM DATA
8 PROBLEM CONVERSION PROGRAM
9 MULTI-ISING CHIP CONTROL PROGRAM
11 ISING CHIP GROUP
12 CONTROL UNIT
13 ISING CHIP
14 INTER-CHIP WIRING
15 CONTROLLER
16 INTERACTION CLOCK GENERATOR
17 RANDOM NUMBER GENERATOR
20 SPIN ARRAY
24 INTER-CHIP CONNECTION UNIT
40 SPIN UNIT
44 MAJORITY CIRCUIT
49 RANDOM NUMBER SIGNAL LINE (RND LINE)
50 RANDOM NUMBER SIGNAL LINE (RND LINE)
51 RANDOM NUMBER SIGNAL LINE (RND LINE),
N, H[U], $J_k[U]$ (0≤U≤1, 1≤K≤5) MEMORY CELL

The invention claimed is:

1. A semiconductor device which performs a non-linear operation, comprising:
a memory;
a reading unit that reads data from the memory;
a majority circuit coupled to a plurality of spin value signal lines that inputs a result of a predetermined operation on the data read by the reading unit;
a write circuit that receives an output of the majority circuit; and
a control unit that controls the memory, the reading unit, the majority circuit, and the write circuit,
wherein the control unit has a step of calculation using a parameter T determined by the control unit regardless of a value in the memory, and
wherein in the step,
the value of the predetermined signal in the semiconductor device is stochastically inverted based on a result of the calculation, and
"1" is randomly output with a probability f(x,T) given by function $$f(x, T) = \frac{1}{2}\left\{1 + \tanh\left(\frac{x}{T}\right)\right\}$$

which includes a hyperbolic tangent function with an argument as a value x determined by the value in the memory, and
wherein a value of a predetermined signal is stochastically inverted at a preceding stage of the majority circuit.

2. A semiconductor device which performs calculation of an interaction model, comprising:
a plurality of memories that retain one or a plurality of values, respectively,
a reading unit that reads data from the plurality of memories,
a majority circuit coupled to a plurality of spin value signal lines that inputs a result of a predetermined operation on the data read by the reading unit; and
a write circuit that receives an output of the majority circuit,
wherein a value of a predetermined signal is stochastically inverted at a preceding stage of the majority circuit,
wherein the semiconductor device is a device which calculates a ground state which is a spin arrangement which minimizes an energy of the Ising model or calculates an approximate solution of the ground state as a solution to a problem, or simulates the Ising model,
wherein the semiconductor device further comprises a control unit that controls the memory, the reading unit, the majority circuit, and the write circuit,
wherein the control unit has a step of calculation using a parameter T determined by the control unit regardless of a value in the memory, and
wherein in the step,
the value of the predetermined signal in the semiconductor device is stochastically inverted based on a result of the calculation, and
"1" is output randomly with a probability f(x, T) given by function $$f(x, T) = \frac{1}{2}\left\{1 + \tanh\left(\frac{x}{T}\right)\right\}$$

which includes a hyperbolic tangent function with an argument as a value x determined by the value in the memory.

3. A semiconductor device which performs calculation of an interaction model, comprising:
a plurality of memories that retain one or a plurality of values, respectively;
a reading unit that reads data from the plurality of memories;
a majority circuit coupled to a plurality of spin value signal lines that inputs a result of a predetermined operation on the data read by the reading unit; and
a write circuit that receives an output of the majority circuit,
wherein a value of a predetermined signal is stochastically inverted at a preceding stage of the majority circuit,
wherein the semiconductor device is a device which calculates a ground state which is a spin arrangement which minimizes an energy of the Ising model or calculates an approximate solution of the ground state as a solution to a problem, or simulates the Ising model,
wherein a random number signal line is provided in the preceding stage of the majority circuit, and the value of the predetermined signal which is input to the majority circuit is stochastically inverted, based on a random number signal applied from the random number signal line,
wherein the semiconductor device further comprises a control unit that controls the memory, the reading unit, the majority circuit, and the write circuit,
wherein in a case where a number of interactions between spins is L, the control unit supplies the random number signal line with a random signal which is "1", with a probability p calculated by $$p = \frac{1}{2}\left(1 - \frac{1}{\sqrt{1 + \frac{T^2}{\pi L}}}\right)$$

and, wherein a parameter T is determined by the control unit.

4. An information processing device in which a semiconductor device which is operable as a CPU, a main memory, a storage device, and an accelerator is connected through a system bus, wherein the semiconductor device is a semiconductor device that performs a non-linear operation, including:
a memory,
a reading unit that reads data from the memory,
a majority circuit coupled to a plurality of spin value signal lines that inputs a result of a predetermined operation on the data read by the reading unit, and
a write circuit that receives an output of the majority circuit, and wherein a value of a predetermined signal is stochastically inverted at a preceding stage of the majority circuit, wherein the semiconductor device includes a control unit that controls the memory, the reading unit, the majority circuit, and the write circuit, wherein the control unit has a step of calculation using a parameter T determined by the control unit regardless of a value in the memory, and wherein the step, the value of the predetermined signal in the semiconductor device is stochastically inverted based on a result of the calculation, and "1" is output randomly with a probability f(x, T) given by function $$f(x, T) = \frac{1}{2}\left\{1 + \tanh\left(\frac{x}{T}\right)\right\}$$

which includes a hyperbolic tangent function with an argument as a value x determined by the value in the memory.

* * * * *